(12) United States Patent
Shiiba

(10) Patent No.: US 12,055,824 B1
(45) Date of Patent: Aug. 6, 2024

(54) DISPLAY DEVICE

(71) Applicant: Panasonic Intellectual Property Management Co., Ltd., Osaka (JP)

(72) Inventor: Ken Shiiba, Ishikawa Ken (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/404,609

(22) Filed: Jan. 4, 2024

(30) Foreign Application Priority Data

Jan. 31, 2023 (JP) .................................. 2023-013221

(51) Int. Cl.
| | | |
|---|---|---|
| G02F 1/1343 | (2006.01) | |
| G02F 1/1335 | (2006.01) | |
| G02F 1/1368 | (2006.01) | |
| H10K 59/50 | (2023.01) | |

(52) U.S. Cl.
CPC .. *G02F 1/134309* (2013.01); *G02F 1/133514* (2013.01); *G02F 1/133528* (2013.01); *G02F 1/13439* (2013.01); *G02F 1/1368* (2013.01); *H10K 59/50* (2023.02)

(58) Field of Classification Search
None
See application file for complete search history.

(56) References Cited

U.S. PATENT DOCUMENTS

| | | | |
|---|---|---|---|
| 8,953,120 B2 | 2/2015 | Yamazaki et al. | |
| 9,857,628 B2 | 1/2018 | Yamazaki et al. | |
| 2010/0201927 A1* | 8/2010 | Kuo | G02F 1/133555 |
| | | | 349/114 |

FOREIGN PATENT DOCUMENTS

| | | |
|---|---|---|
| JP | 4114451 | 7/2008 |
| JP | 2016-184175 | 10/2016 |

\* cited by examiner

*Primary Examiner* — Richard H Kim
(74) *Attorney, Agent, or Firm* — Greenblum and Bernstein, P.L.C.

(57) ABSTRACT

A display device according to the present disclosure includes first and second substrates transmitting visible light, light emitting pixels, a first internal layer, a liquid crystal layer, a first electrode reflecting visible light, and second to fourth electrodes transmitting visible light. The light emitting pixels independently emit light. The liquid crystal layer is located between the first and second substrates. The first electrode is located between at least one of the light emitting pixels and the liquid crystal layer. The second electrode is located between the liquid crystal layer and the first substrate without overlapping the first electrode in plan view. The third electrode is located between the liquid crystal layer and the second substrate while overlapping the first electrode in plan view. The fourth electrode is located between the liquid crystal layer and the second substrate while overlapping the second electrode in plan view.

19 Claims, 12 Drawing Sheets

DISPLAY DEVICE

CROSS-REFERENCE TO RELATED APPLICATIONS

This application is based upon and claims the benefit of priority from Japanese Patent Application No. 2023-013221, filed on Jan. 31, 2023, the entire contents of which are incorporated herein by reference.

FIELD

Embodiments described herein relate generally to a display device.

BACKGROUND

There has been known a technique of configuring a display device as a transparent display that includes a double-sided light emission type light emitting layer, and that can display an image or character information on both surfaces based on light from the light emitting layer and transmit external light from one display surface side to the other display surface side (e.g., JP 2016-184175 A).

However, when an amount of external light is larger compared with an amount of light from the light emitting layer, it may be hard to see display based on the light from the light emitting layer.

An object of the present disclosure is to improve visibility of a display device.

SUMMARY

A display device according to the present disclosure includes a first substrate, a plurality of light emitting pixels, a first internal layer, a second substrate, a liquid crystal layer, and first to fourth electrodes. The first substrate includes a first surface and a second surface on an opposite side of the first surface, the first substrate transmitting visible light in a direction perpendicular to the first surface and the second surface. The plurality of light emitting pixels are configured to be capable of emitting light independently of one another. The first internal layer is disposed on the first surface, the first internal layer including a first circuit configuration that is a circuit configuration electrically connected to each of the plurality of light emitting pixels. The second substrate transmits visible light. The liquid crystal layer is located between the first substrate and the second substrate in a first cross section that is a cross section in a direction perpendicular to the first surface. The first electrode is located between at least one of the plurality of light emitting pixels and the liquid crystal layer in the first cross section, the first electrode reflecting visible light. The second electrode is located between the liquid crystal layer and the first substrate in the first cross section without overlapping with the first electrode in plan view, the second electrode transmitting visible light. The third electrode is located between the liquid crystal layer and the second substrate in the first cross section while overlapping the first electrode in plan view, the third electrode transmitting visible light. The fourth electrode is located between the liquid crystal layer and the second substrate in the first cross section while overlapping the second electrode in plan view, the fourth electrode transmitting visible light.

DETAILED DESCRIPTION

Figure 1:
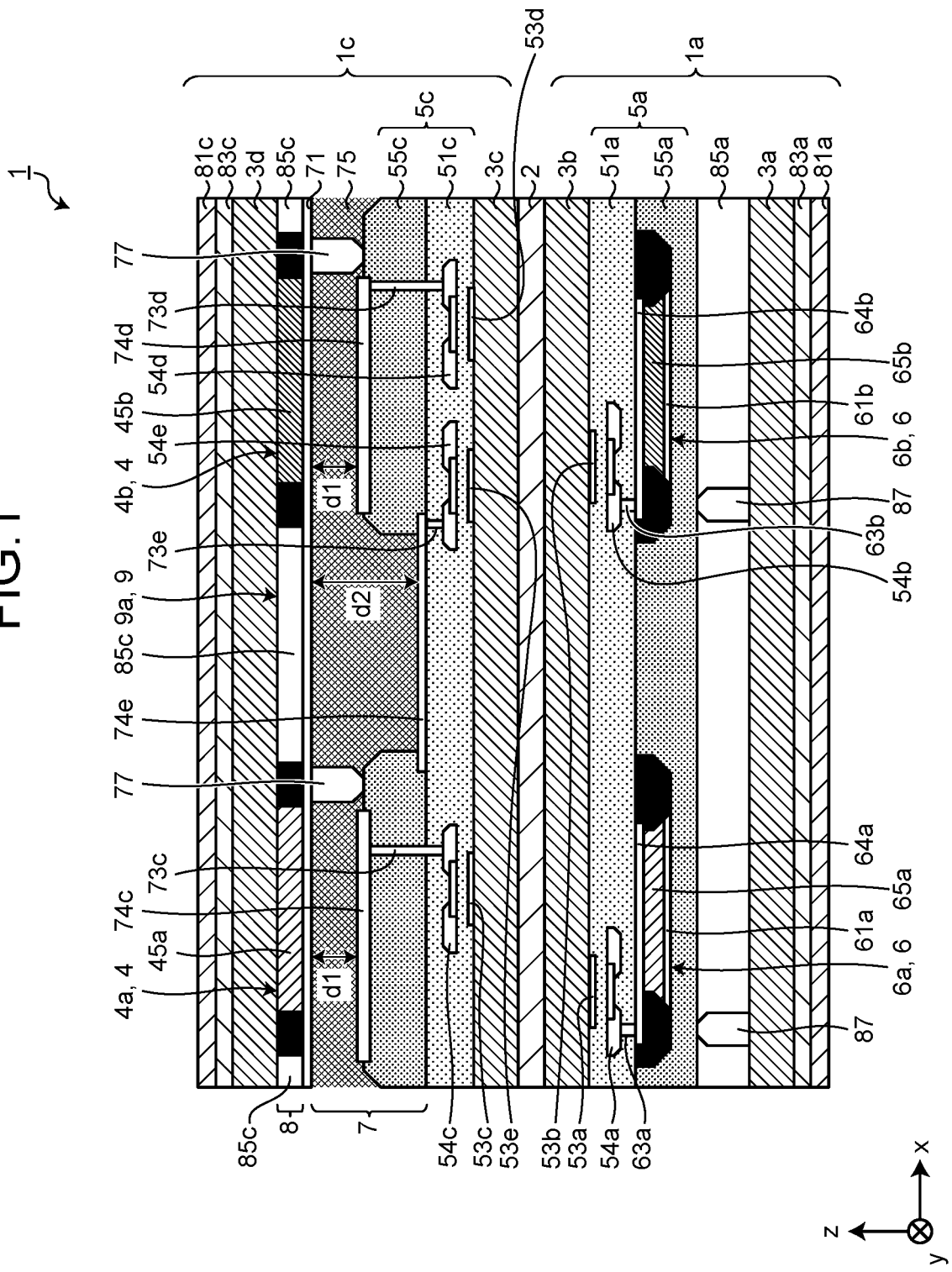
FIG. 1 is a cross-sectional view schematically illustrating an example of a configuration of a display device according to a first embodiment.

Embodiments of a display device according to the present disclosure will be explained below with reference to the accompanying drawings. Note that configurations of the display devices according to the embodiments of the present disclosure are examples and are not limited to the following description content.

Note that, in the explanation of the present disclosure, components having the same or substantially the same functions as functions described in other drawings are denoted by the same reference numerals, and the explanation the components is sometimes omitted as appropriate. Even if the same or substantially the same portions are represented, dimensions and ratios of the portions are sometimes represented differently depending on the drawings. For example, from the viewpoint of ensuring visibility of the drawings, in explanation of the drawings, only main components are denoted by reference numerals and signs and, even components having the same or substantially the same functions as the functions described in other drawings may are sometimes not denoted by the reference numerals and signs.

Note that, in the explanation of the present disclosure, alphanumeric characters or the like may be added to the ends of reference numerals and signs to distinguish components having the same or similar functions. In the explanation of the present embodiments, a plurality of components having the same or similar functions are sometimes collectively referred to by omitting alphanumeric characters or the like at the ends of reference numerals and signs.

Note that, in the explanation of the present disclosure, for simplification of explanation, it is assumed that the front surface and the rear surface of a display device are respectively surfaces parallel to an x-y plane. It is assumed that a direction from the front surface to the rear surface of the display device is a z+ direction. That is, in the explanation of the present disclosure, the front surface side means a z– side. Similarly, the rear surface side means a z+ side.

Note that, in the explanation of the present disclosure, "transparent" includes a concept of "having transparency or translucency". That is, "transparent" includes not only transmitted light being not absorbed but also a degree of the transmitted light being absorbed being small. In addition, "opaque" includes a concept of "opaque or translucency being small". That is, "opaque" is not limited to light being not transmitted, that is, being blocked but also a degree of transmitted light being absorbed being large. In the explanation of the present disclosure, "transmittance" indicates a ratio of brightness or a light amount of visible light passing through a panel to brightness or a light amount of visible light made incident on the panel. In other words, "transmittance" is a transmittance with respect to visible light.

Note that, in the explanation of the present disclosure, "external light" is ambient light such as illumination light or natural light made incident on the front or rear surface of the display device from the outside of the display device, that is, the surrounding environment.

A display device according to the present disclosure is a double-sided display type transparent display that is capable of displaying an image and character information on both surfaces based on light from at least one of a light emitting section, a reflecting section, and a transmitting section and can transmit external light from one display surface side to the other display surface side.

Note that the display device according to the present disclosure can be used as, for example, a transparent display of a video reproduction device or a navigation device mounted on an automobile. As an example, the display device according to the present disclosure is provided at a boundary between an environment having a large influence of external light such as the outside of a vehicle or the outdoors and an environment having a small influence of external light such as the inside of a vehicle or the interior of a room, for example, a part or all of a window or an outer plate surface of an automobile or a part or all of a window or a wall surface of a building. Here, the "environment having a large influence of external light" means that a light amount of external light is larger compared with a light amount of light from the light emitting section of the display device.

For example, the display device according to the present disclosure can be disposed such that one display surface faces an "environment having a large influence of external light" and the other display surface faces an "environment having a small influence of external light". As an example, when the display device according to the present disclosure is used as a part or all of a window or an outer plate surface of an automobile, the front surface side of the display device faces the inner side of a vehicle interior and can be visually recognized from the inside of the vehicle. Similarly, the rear surface side of the display device faces the outer side and can be visually recognized from the outside of the vehicle.

First Embodiment

FIG. 1 is a cross-sectional view schematically illustrating an example of a configuration of a display device 1 according to a first embodiment. FIG. 1 illustrates a first cross section in a direction perpendicular to a surface on a front surface side of a glass substrate 3b.

As illustrated in FIG. 1, the display device 1 according to the present embodiment includes an organic EL display (OLED) 1a and a reflective display (RD) 1c.

The OLED 1a is configured as a top emission type transparent display. According to the top emission type OLED 1a, it is possible to make display brighter than a bottom emission type OLED. The OLED 1a is provided on the z– side of the display device 1. The display surface of the OLED 1a is on the z– side of the display device 1.

The RD 1c is provided on the rear surface side of the display device 1. The RD 1c is configured as a reflective transparent display. As the RD 1c, for example, a reflective liquid crystal display (LCD) can be used. However, a reflective display formed using a material other than liquid crystal may be used. Note that, in the explanation of the present disclosure, a case in which a reflective LCD is applied as the RD 1c is illustrated. A display surface of the RD 1c is the back surface side of the display device 1.

The display device 1 according to the present embodiment is formed by bonding the OLED 1a and the RD 1c via an adhesive layer 2. Specifically, the glass substrate 3b on the rear surface side of the OLED 1a and a glass substrate 3c on the z– side of the RD 1c are bonded by the adhesive layer 2. The adhesive layer 2 is transparent to visible light and is formed of, for example, an OCA (Optically Clear Adhesive).

Configuration of the OLED

As illustrated in FIG. 1, the OLED 1a includes a glass substrate 3a, a glass substrate 3b, a thin film transistor (TFT) substrate 5a, a polarizing plate 81a, a λ/4 phase difference plate 83a, and a sealing layer 85a.

The glass substrate 3a and the glass substrate 3b are disposed be separated substantially in parallel. The glass substrate 3a is provided on the z– side of the display device 1, that is, the display surface side of the OLED 1a. The glass substrate 3b is provided on the rear surface side of the display device 1, that is, on the RD 1c side. Here, the glass substrate 3b according to the first embodiment is an example of the first substrate. The surface on the front surface side of the glass substrate 3b according to the first embodiment is an example of the first surface. The surface on the rear surface side of the glass substrate 3b according to the first embodiment is an example of the second surface. The glass substrate 3a according to the first embodiment is an example of the third substrate.

The TFT substrate 5a is provided between the glass substrate 3a and the glass substrate 3b, for example, on the z– side of the glass substrate 3b. On the TFT substrate 5a, a plurality of light emitting sections 6 are provided. The plurality of light emitting sections 6 are configured to be capable of emitting light independently of one another. As explained below with reference to FIG. 12, the plurality of light emitting sections 6 are arrayed in a matrix on the TFT substrate 5a. Each of the plurality of light emitting sections 6 corresponds to any one of an R light emitting pixel 100R_n, a G light emitting pixel 100G_n, and a B light emitting pixel 100B_n (n is a natural number).

FIG. 1 illustrates a light emitting section 6a and a light emitting section 6b among the plurality of light emitting sections 6. The light emitting section 6a includes a gate electrode 53a, a source-drain electrode 54a, a transparent electrode 61a, a reflecting electrode 64a, a connecting electrode 63a, and a light emitting layer 65a. The light emitting section 6b includes a gate electrode 53b, a source-drain electrode 54b, a transparent electrode 61b, a reflecting electrode 64b, a connecting electrode 63b, and a light emitting layer 65b.

Figure 12:
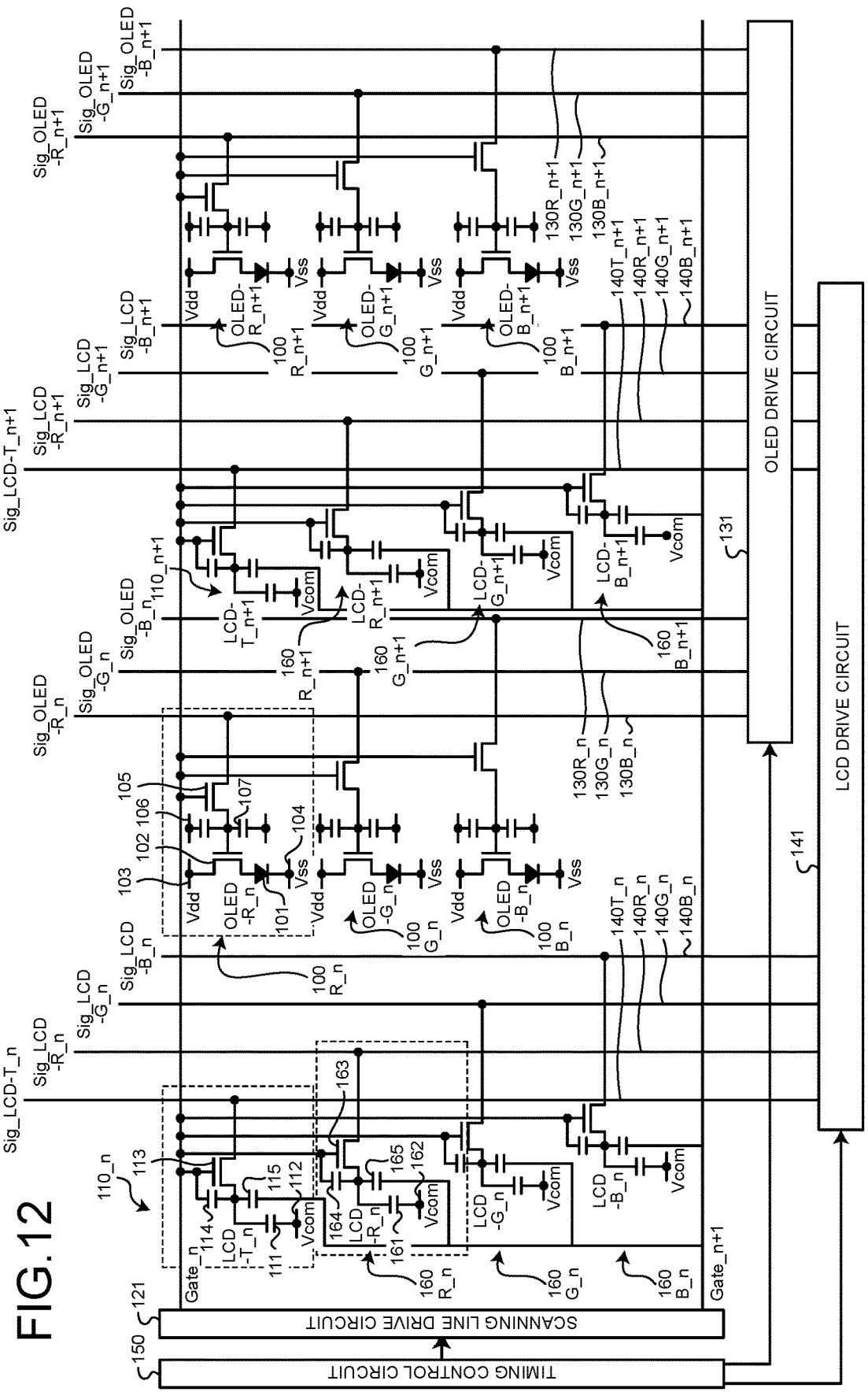
FIG. 12 is a diagram schematically illustrating an example of a circuit configuration of a thin film transistor (TFT) substrate of a display device according to the embodiments.

Here, the gate electrode 53a and the source-drain electrode 54a configure a TFT 102 corresponding to the light emitting section 6a among a plurality of TFTs 102 in FIG. 12. The gate electrode 53b and the source-drain electrode 54b configure the TFT 102 corresponding to the light emitting section 6b among the plurality of TFTs 102 in FIG. 12.

In the TFT substrate 5a, each of the plurality of TFTs 102 is covered by an insulating member 51a. Each of the transparent electrode 61a, the transparent electrode 61b, the reflecting electrode 64a, the reflecting electrode 64b, the light emitting layer 65a, and the light emitting layer 65b is covered by an insulating member 55a. Here, the TFT substrate 5a according to the first embodiment or the plurality of TFTs 102 covered by the insulating member 51a on the TFT substrate 5a is an example of the first internal layer. A circuit configuration including the plurality of TFTs 102 according to the first embodiment is an example of the first circuit configuration.

The transparent electrode 61a and the transparent electrode 61b are respectively provided on the z− side of the light emitting section 6a and the light emitting section 6b.

The reflecting electrode 64a and the reflecting electrode 64b are respectively provided on the z+ side of the light emitting section 6a and the light emitting section 6b. The reflecting electrode 64a is provided in a position facing the transparent electrode 61a to be separated from the transparent electrode 61a substantially parallel. The reflecting electrode 64b is provided at a position facing the transparent electrode 61b to be separated from the transparent electrode 61b substantially in parallel. The reflecting electrode 64a and the reflecting electrode 64b are respectively provided to be separated from the TFTs 102 corresponding thereto via insulating members 51a.

Each of the connecting electrode 63a and the connecting electrode 63b extends in the z direction on the inside of the insulating member 51a. The connecting electrode 63a electrically connects the reflecting electrode 64a and the source-drain electrode 54a. The connecting electrode 63b electrically connects the reflecting electrode 64b and the source-drain electrode 54b.

The light emitting layer 65a and the light emitting layer 65b according to the first embodiment are located between layers of the plurality of TFTs 102 covered by the insulating member 51a and the glass substrate 3b. That is, in the display device 1 according to the first embodiment, the light emitting layer 65a and the light emitting layer 65b are located between the glass substrate 3a and the glass substrate 3b. The light emitting layer 65a is provided between the transparent electrode 61a and the reflecting electrode 64a. The light emitting layer 65a emits light when a voltage exceeding a threshold voltage is applied between the transparent electrode 61a and the reflecting electrode 64a. The light emitting layer 65b is provided between the transparent electrode 61b and the reflecting electrode 64b. The light emitting layer 65b emits light when a voltage exceeding the threshold voltage is applied between the transparent electrode 61b and the reflecting electrode 64b. As explained below with reference to FIG. 12, the light emitting layer 65a and the light emitting layer 65b configure a light emitting element 101 provided in a light emitting pixel 100_n corresponding thereto among a plurality of light emitting pixels 100_n (n is a natural number). Each of the light emitting layer 65a and the light emitting layer 65b is a light emitting diode (LED) made of an organic compound.

The polarizing plate 81a is provided on the z− side of the glass substrate 3a, that is, on the side of the glass substrate 3a opposite to the glass substrate 3b. That is, the glass substrate 3b is located between the polarizing plate 81a and a transparent electrode 74e. The polarizing plate 81a polarizes visible light. Here, the polarizing plate 81a according to the embodiment is an example of the first polarizing layer.

The λ/4 phase difference plate 83a is provided between the glass substrate 3a and the polarizing plate 81a. That is, the λ/4 phase difference plate 83a is located between the polarizing plate 81a and the glass substrate 3b. The λ/4 phase difference plate 83a according to the embodiment is an example of the first λ/4 phase difference plate.

The sealing layer 85a is provided between the glass substrate 3a and the glass substrate 3b. Specifically, the sealing layer 85a includes a spacer 87. The spacer 87 forms a sealing layer 85a serving as a gap between the glass substrate 3a and the TFT substrate 5a. That is, in the OLED 1a, the glass substrate 3a and the TFT substrate 5a are separated by the length of the spacer 87 in the z direction and provided substantially in parallel.

Configuration of the Reflective Display

As illustrated in FIG. 1, the RD 1c includes the glass substrate 3c, a glass substrate 3d, a TFT substrate 5c, a dimming layer 7, a filter layer 8, a polarizing plate 81c, a λ/4 phase difference plate 83c, and a transparent insulating layer 85c.

The glass substrate 3c and the glass substrate 3d are disposed to be separated in substantially parallel. The glass substrate 3c is provided on the z− side of the display device 1, that is, the OLED 1a side. The glass substrate 3d is provided on the z+ side of the display device 1, that is, the display surface side of the RD 1c. Here, the glass substrate 3d according to the embodiment is an example of the second substrate. The glass substrate 3c according to the first embodiment is an example of the fourth substrate. The surface on the rear surface side of the glass substrate 3c according to the first embodiment is an example of the third surface. The surface on the front surface side of the glass substrate 3c according to the first embodiment is an example of the fourth surface.

A plurality of reflecting sections 4 and a plurality of transmitting sections 9 are provided in the RD 1c. The plurality of reflecting sections 4 are respectively configured to be capable of reflecting independently of one another. The plurality of transmitting sections 9 are respectively configured to be capable of dimming independently of each other. As explained below with reference to FIG. 12, the plurality of reflecting sections 4 and the plurality of transmitting sections 9 are arrayed in matrixes on the TFT substrate 5c. Each of the plurality of reflecting sections 4 corresponds to any one of an R reflecting pixel 160R_n, a G reflecting pixel 160G_n, and a B reflecting pixel 160B_n (n is a natural number). Each of the plurality of transmitting sections 9 corresponds to a dimming pixel 110_n (n is a natural number).

FIG. 1 illustrates a reflecting section 4a and a reflecting section 4b among the plurality of reflecting sections 4 and a transmitting section 9a among the plurality of transmitting sections 9. The reflecting section 4a includes a gate electrode 53c, a source-drain electrode 54c, a transparent electrode 71, a reflecting electrode 74c, a connecting electrode 73c, and a color filter 45a. The reflecting section 4b includes a gate electrode 53d, a source-drain electrode 54d, a transparent electrode 71, a reflecting electrode 74d, a connecting electrode 73d, and a color filter 45b. The transmitting section 9a includes a gate electrode 53e, a source-drain electrode 54e, a transparent electrode 71, a transparent electrode 74e, a connecting electrode 73e, and the transparent insulating layer 85c.

Here, the gate electrode 53c and the source-drain electrode 54c configure a TFT 163 corresponding to the reflecting section 4a among a plurality of TFTs 163 illustrated in FIG. 12. The gate electrode 53d and the source-drain electrode 54d configure the TFT 163 corresponding to the reflecting section 4b among the plurality of TFTs 163 illustrated in FIG. 12. The gate electrode 53e and the source-drain electrode 54e configure a TFT 113 corresponding to the transmitting section 9a among a plurality of TFTs 113 illustrated in FIG. 12.

The TFT substrate 5c is provided between the glass substrate 3c and the filter layer 8, for example, on the z+ side of the glass substrate 3c. Here, the TFT substrate 5c according to the first embodiment is an example of the second internal layer.

On the TFT substrate 5c, the gate electrode 53c, the gate electrode 53d, the gate electrode 53e, the source-drain electrode 54c, the source-drain electrode 54d, the source-drain electrode 54e, the connecting electrode 73c, the connecting electrode 73d, and the connecting electrode 73e are provided.

Each of the connecting electrode 73c, the connecting electrode 73d, and the connecting electrode 73e extends in the z direction on the inside of an insulating member 51c. The connecting electrode 73c electrically connects the reflecting electrode 74c and the source-drain electrode 54c. The connecting electrode 73d electrically connects the reflecting electrode 74d and the source-drain electrode 54d. The connecting electrode 73e electrically connects the transparent electrode 74e and the source-drain electrode 54e.

In the TFT substrate 5c, each of the plurality of TFTs 113 and the plurality of TFTs 163 are covered by an insulating member 51c. On the z+ side of the TFT substrate 5c, an insulating member 55c is provided in a position facing each of the reflecting section 4a and the reflecting section 4b. The length of the insulating member 55c in the z direction is ½ times the length of the dimming layer 7 in the z direction. Here, a layer of the TFT substrate 5c according to the first embodiment or the plurality of TFTs 113 and the plurality of TFTs 163 covered by the insulating member 51c in the TFT substrate 5c is an example of the second internal layer. A circuit configuration including the plurality of TFTs 163 of the TET substrate 5c according to the first embodiment is an example of the second circuit configuration. A circuit configuration including the plurality of TFTs 113 of the TFT substrate 5c according to the first embodiment is an example of the third circuit configuration.

The dimming layer 7 is provided between the glass substrate 3b and the glass substrate 3d. The dimming layer 7 according to the first embodiment is located between the glass substrate 3c and the glass substrate 3d. Specifically, the dimming layer 7 is provided between the filter layer 8 and the TFT substrate 5c. Here, the dimming layer 7 according to the embodiment is an example of the liquid crystal layer. A spacer 77 is located in the dimming layer 7.

The transparent electrode 71 is located between the glass substrate 3d and the filter layer 8. The transparent electrode 71 is provided on the z− side of the filter layer 8.

As an example, the transparent electrode 71 may overlap the reflecting electrode 74c and the reflecting electrode 74d in plan view. That is, the transparent electrode 71 may be provided over the at least one reflecting electrode 74c and the at least one reflecting electrode 74d and may be shared by the at least one reflecting section 4 and the at least one transmitting section 9. In this case, the transparent electrode 71 according to the embodiment is an example of the third electrode and the fourth electrode that are integrally formed. With this configuration, the number of steps relating to manufacturing can be reduced compared with when the transparent electrode 71 is formed for each of the reflecting electrode 74c and the reflecting electrode 74d.

As an example, the transparent electrode 71 may include an electrode overlapping the reflecting electrode 74c in a plan view and an electrode separated from the electrode and overlapping the reflecting electrode 74d in plan view. That is, the transparent electrode 71 according to the embodiment may be divided into two or more electrodes. In this case, among two or more electrodes of the transparent electrode 71 according to the embodiment, an electrode overlapping the reflecting electrode 74c in plan view is an example of the third electrode. Among two or more electrodes of the transparent electrode 71 according to the embodiment, an electrode overlapping the reflecting electrode 74d in plan view is an example of the fourth electrode.

Each of the reflecting electrode 74c and the reflecting electrode 74d is located between at least one of the plurality of light emitting pixels 100_n and the dimming layer 7. Each of the reflecting electrode 74c and the reflecting electrode 74d is provided on the z+ side of the insulating member 55c of the TFT substrate 5c, that is, at the boundary between the insulating member 55c and a dimming member 75. The reflecting electrode 74c and the reflecting electrode 74d are respectively provided on the z− side of the transparent electrode 71. The reflecting electrode 74c and the reflecting electrode 74d are respectively provided to be separated by a distance d1 substantially in parallel to the transparent electrode 71. Note that each of the reflecting electrode 74c and the reflecting electrode 74d may not be provided in positions corresponding to all the light emitting pixels 100_n. Here, the reflecting electrode 74c and the reflecting electrode 74d according to the embodiment are respectively examples of a first electrode. In addition, a region of a dimming member 75a located between "the reflecting electrode 74c and the reflecting electrode 74d" and the transparent electrode 71 according to the embodiment is an example of the first portion. The distance d1 according to the embodiment is an example of the thickness of the first portion.

The transparent electrode 74e is located between the glass substrate 3b and the dimming layer 7. The transparent electrode 74e does not overlap each of the reflecting electrode 74c and the reflecting electrode 74d in plan view. The transparent electrode 74e is provided on the z+ side of the insulating member 51c of the TFT substrate 5c, that is, at the boundary between the insulating member 51c and the dimming member 75. The transparent electrode 74e is provided on the z− side of the transparent electrode 71. The transparent electrode 74e is provided to be separated from the transparent electrode 71 by a distance d2 substantially parallel to the transparent electrode 71. The distance d2 is twice or approximately twice the distance d1. With this configuration, optical path lengths in the dimming layer 7 of light reflected by each of the reflecting electrode 74c and the reflecting electrode 74d and light transmitted through the transparent electrode 74e can be equalized. Here, the transparent electrode 74e according to the embodiment is an example of the second electrode. A region of a dimming member 75b located between the transparent electrode 74e and the transparent electrode 71 according to the embodiment is an example of the second portion. The distance d2 according to the embodiment is an example of the thickness of the second portion.

The spacer 77 is a member for forming gaps, in which the dimming member 75 is filled, between the reflecting electrode 74c, the reflecting electrode 74d, and the transparent electrode 74e and the transparent electrode 71. The transparent electrode 71 is provided on the z– side of the insulating member 55c via the spacer 77. In other words, the transparent electrode 71 is provided to be separated from each of the reflecting electrode 74c and the reflecting electrode 74d by the length of the spacer 77 in the z direction.

Dimming member 75 is filled between the reflecting electrode 74c, the reflecting electrode 74d, and the transparent electrode 74e and transparent electrode 71. Between the reflecting electrode 74c and the transparent electrode 71, between the reflecting electrode 74d and the transparent electrode 71, and between the transparent electrode 74e and the transparent electrode 71, a state of the dimming member 75 changes in a state in which a voltage is applied and a state in which a voltage is not applied.

As the dimming member 75, a normally white material and a normally black material can be used as appropriate. Examples of the normally white material include TN (Twisted Nematic) liquid crystal and ECB (Electrically Controlled Birefringence) liquid crystal. Examples of the normally black material include VA (Vertical Alignment) liquid crystal, guest-host liquid crystal, PNLC (polymer network liquid crystal), SPD (suspended particles), and an electrochromic material. Note that the dimming member 75 only has to be selected as appropriate according to, for example, characteristics of an operating voltage and response speed.

For example, between the reflecting electrode 74c and the transparent electrode 71, between the reflecting electrode 74d and the transparent electrode 71, and between the transparent electrode 74e and the transparent electrode 71, the dimming member 75 transitions between a transmission mode for transmitting visible light and a dimming mode for blocking visible light according to a voltage applied by the TFT 113 and the TFT 163. In other words, in the dimming layer 7, transmittance with respect to visible light changes according to the voltage applied by the TFT 113 and the TET 163. Therefore, it is preferable that the dimming member 75 has an operation voltage required for the mode transition low enough for the dimming member 75 to be driven by the TFT substrate 5c.

Details of the transition is explained using the dimming member 75 located between the reflecting electrode 74c and the transparent electrode 71 as an example. For example, when the dimming member 75 is a normally white material, in a state in which no voltage is applied between the reflecting electrode 74c and the transparent electrode 71, the dimming layer 7 is transparent to visible light when being sandwiched by the polarizing plate 81a and the polarizing plate 81c. On the other hand, in a state where a voltage exceeding the threshold voltage is applied between the reflecting electrode 74c and the transparent electrode 71, the dimming layer 7 becomes opaque to visible light when being sandwiched by the polarizing plate 81a and the polarizing plate 81c. The dimming layer 7 sandwiched by the polarizing plate 81a and the polarizing plate 81c becoming transparent or opaque is sometimes simply described that the dimming layer 7 becomes transparent or opaque. Depending on a material used as the normally white material, the dimming layer 7 itself sometimes becomes transparent or opaque. In that case, the polarizing plate 81a and the polarizing plate 81c may not be used.

For example, when the dimming member 75 is TN liquid crystal, in a state in which no voltage is applied between the reflecting electrode 74c and the transparent electrode 71, the dimming member 75 is arrayed horizontally with respect to the reflecting electrode 74c and the transparent electrode 71. At this time, when being sandwiched by the polarizing plate 81a and the polarizing plate 81c, the dimming layer 7 is transparent to visible light. On the other hand, in a state in which a voltage exceeding the threshold voltage is applied between the reflecting electrode 74c and the transparent electrode 71, the dimming member 75 is arrayed perpendicularly to the reflecting electrode 74c and the transparent electrode 71. Consequently, when being sandwiched by the polarizing plate 81a and the polarizing plate 81c, the dimming layer 7 becomes opaque to visible light.

On the other hand, for example, when the dimming member 75 is a normally black material, in a state in which no voltage is applied between the reflecting electrode 74c and the transparent electrode 71, the dimming layer 7 is opaque to visible light when being sandwiched by the polarizing plate 81a and the polarizing plate 81c. On the other hand, in a state in which a voltage exceeding the threshold voltage is applied between the reflecting electrode 74c and the transparent electrode 71, the dimming layer 7 becomes transparent to visible light when being sandwiched by the polarizing plate 81a and the polarizing plate 81c. Depending on a material used as the normally black material, the dimming layer 7 itself sometimes becomes transparent or opaque. For example, the dimming layer 7 becomes transparent or opaque when any one of guest-host liquid crystal, PNLC, SPD, and an electrochromic material is used as the normally black material. In that case, the polarizing plate 81a and the polarizing plate 81c may not be used.

The filter layer 8 is provided between the transparent electrode 71 and the glass substrate 3d, for example, on the z-side of the glass substrate 3d. The color filter 45a, the color filter 45b, and the transparent insulating layer 85c are provided in the filter layer 8.

The color filter 45a is located between the glass substrate 3d and the reflecting electrode 74c. Specifically, the color filter 45a is provided in a position facing the reflecting electrode 74c in the reflecting section 4a. The color filter 45b is located between the glass substrate 3d and the reflecting electrode 74d. Specifically, the color filter 45a is provided in a position facing the reflecting electrode 74d in the reflecting section 4b. Here, the color filter 45a according to the embodiment is an example of the first color filter. The color filter 45b according to the embodiment is an example of the second color filter.

The transparent insulating layer 85c is provided in a position facing the transparent electrode 74e in the transmitting section 9a. The transparent insulating layer 85c is transparent to visible light. The transparent insulating layer 85c is configured by, for example, an insulator. As the insulator forming the transparent insulating layer 85c, for example, an inorganic or organic insulating film can be used. As an example, the transparent insulating layer 85c can be formed by stacking inorganic or organic insulating films.

The transparent insulating layer 85c is provided to align height with the height of the color filter 45a and the color filter 45b. The transparent electrode 71 can be formed flat when the heights of the color filter 45a, the color filter 45b, and the transparent insulating layer 85c, that is, the height of the filter layer 8 is aligned.

Note that a color filter may be provided between the glass substrate 3d and the transparent electrode 74e, that is, in a position facing the transparent electrode 74e in the transmitting section 9a. The transparent insulating layer 85c is not an essential component and may not be provided in the display device 1. That is, a color filter may be provided instead of the transparent insulating layer 85c or in addition to the transparent insulating layer 85c.

Note that the filter layer 8 may be formed as one color filter in which a plurality of wavelength selection regions having selectivity of two or more wavelengths corresponding to the color filters 45a and 45b and a region having no wavelength selectivity such as the transparent insulating layer 85c are arrayed in a matrix. Alternatively, in the filter layer 8 formed as one color filter, a region having no wavelength selectivity may not be provided.

The polarizing plate 81c is provided on the z− side of the glass substrate 3d, that is, the side of the glass substrate 3d opposite to the glass substrate 3c. That is, the glass substrate 3d is located between the polarizing plate 81c and the transparent electrode 71. The polarizing plate 81c polarizes visible light. Here, the polarizing plate 81c according to the embodiment is an example of the second polarizing layer.

The λ/4 phase difference plate 83c is provided between the glass substrate 3d and the polarizing plate 81c. The λ/4 phase difference plate 83c according to the embodiment is an example of the second λ/4 phase difference plate.

Note that each of the glass substrate 3a, the glass substrate 3b, the glass substrate 3c, and the glass substrate 3d is a plate-like member transparent to visible light. Each of the glass substrate 3a, the glass substrate 3b, the glass substrate 3c, and the glass substrate 3d transmits visible light in a direction perpendicular or substantially perpendicular to the surface on the front surface side and the rear surface side. Each of the glass substrate 3a, the glass substrate 3b, the glass substrate 3c, and the glass substrate 3d has, for example, a rectangular flat plate-like shape. The glass substrate 3a, the glass substrate 3b, the glass substrate 3c, and the glass substrate 3d have, for example, the same shape.

Each of TFT the substrate 5a and the TFT substrate 5c may be formed of a material transparent to visible light. As each of the TFT substrate 5a and the TET substrate 5c, a-Si, LTPS (Low Temperature PolySilicon), IGZO, or the like can be used as appropriate. Each of the TFT substrate 5a and the TFT substrate 5c is formed of, for example, a plate-like member but may be formed of a film-like member.

Each of the insulating member 51a, the insulating member 55a, the insulating member 51c, and the insulating member 55c may be formed of a material that is transparent to visible light and has electrical insulation. As each of the insulating member 51a, the insulating member 55a, the insulating member 51c, and the insulating member 55c, for example, silicon nitride (SiN) and silicon oxide (SiO) can be used.

Each of the transparent electrode 61a, the transparent electrode 61b, the transparent electrode 71, the connecting electrode 73e, and the transparent electrode 74e is transparent to visible light.

Each of the connecting electrode 63a, the connecting electrode 63b, the reflecting electrode 64a, the reflecting electrode 64b, the connecting electrode 73c, the connecting electrode 73d, the reflecting electrode 74c, and the reflecting electrode 74d is opaque to visible light and reflects the visible light. As each of the connecting electrode 63a, the connecting electrode 63b, the reflecting electrode 64a, the reflecting electrode 64b, the connecting electrode 73c, the connecting electrode 73d, the reflecting electrode 74c, and the reflecting electrode 74d, metal, glass and resin having metal layers provided on the surfaces thereof, and the like can be used as appropriate.

Note that each of the transparent electrode 61a, the transparent electrode 61b, the reflecting electrode 64a, the reflecting electrode 64b, the transparent electrode 71, the reflecting electrode 74c, the reflecting electrode 74d, and the transparent electrode 74e has, for example, a rectangular flat plate shape. The transparent electrode 61a and the transparent electrode 61b have, for example, the same shape. The reflecting electrode 64a, the reflecting electrode 64b, and the transparent electrode 74e have, for example, the same shape.

Note that each of the polarizing plate 81a and the polarizing plate 81c may be formed of a plate-like member or may be formed of a film-like member.

Note that each of the λ/4 phase difference plate 83a and the λ/4 phase difference plate 83c may be formed of a plate-like member or may be formed of a film-like member.

Note that the polarizing plate 81a, the polarizing plate 81c, the λ/4 phase difference plate 83a, and the λ/4 phase difference plate 83c are not essential components and may not be provided depending on the material of the dimming member 75. For example, when IN liquid crystal, VA liquid crystal, or ECB liquid crystal is applied as the dimming member 75, the display device 1 can be configured to include the polarizing plate 81a, the polarizing plate 81c, the λ/4 phase difference plate 83a, and the λ/4 phase difference plate 83c. On the other hand, for example, when guest-host liquid crystal, PNLC, SPD, or an electrochromic material is applied as the dimming member 75, the display device 1 can be configured not to include the polarizing plate 81a, the polarizing plate 81c, the λ/4 phase difference plate 83a, and the λ/4 phase difference plate 83c.

Note that, for example, when the polarizing plate 81a and the polarizing plate 81c are unnecessary in the display device 1 according to the material of the dimming member 75, the distance d2 can be set equal to the distance d1. In this case, the transparent electrode 74e can be provided in the same position as the position of each of the reflecting electrode 74c and the reflecting electrode 74d in the z direction. As an example, the insulating member 55c may be provided on the front surface side of the transparent electrode 74e, that is, between the transparent electrode 74e and the insulating member 51c as in each of the reflecting electrode 74c and the reflecting electrode 74d. As an example, the insulating member 55c may not be provided on the front surface side of each of the reflecting electrode 74c and the reflecting electrode 74d, that is, between each of the reflecting electrode 74c and the reflecting electrode 74d and the insulating member 51c as in the transparent electrode 74e.

Note that the sealing layer 85a is transparent to visible light. The sealing layer 85a is provided to reduce deterioration of the OLED 1a. For example, an inert gas is filled in the sealing layer 85a. As the inert gas, for example, nitrogen gas can be used.

Note that the sealing layer 85a is not limited to an aspect in which the inert gas is filled. For example, the inside of the sealing layer 85a may be vacuum. Here, in the present disclosure, vacuum means, for example, a state in which the concentration of at least a part of gases contributing to degradation of the OLED 1*a* such as oxygen gas and hydrogen gas is lower than gas concentration in the surrounding environment, gas molecules may be present, and the vacuum includes a decompressed state. For example, a hygroscopic material may be encapsulated on the inside of the sealing layer 85*a*. For example, the sealing layer 85*a* may be formed by stacking inorganic or organic insulating films.

Note that the sealing layer 85*a* is not an essential component and may not be provided in the display device 1.

Figure 2:
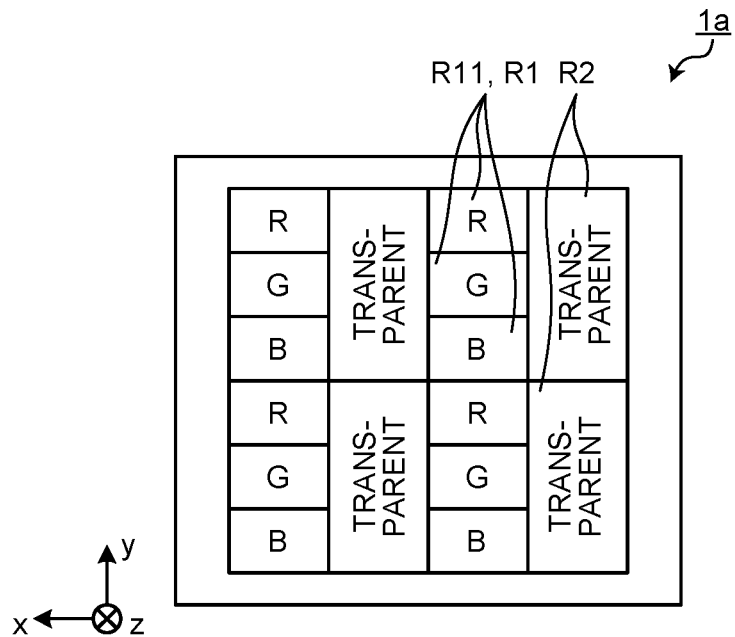
FIG. 2 is a plan view schematically illustrating the example of the configuration of the display device according to the first embodiment.
Figure 3:
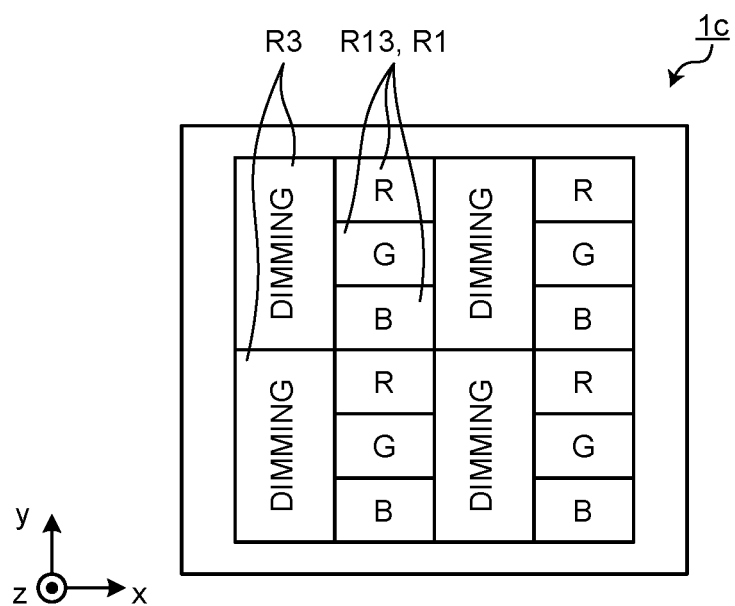
FIG. 3 is a plan view schematically illustrating the example of the configuration of the display device according to the first embodiment.

FIG. 2 and FIG. 3 are plan views schematically illustrating examples of a configuration of the display device 1 according to the first embodiment. FIG. 2 illustrates a configuration of the display device 1 viewed from the display surface side of the OLED 1*a*. FIG. 3 illustrates a configuration of display device 1 viewed from the display surface side of the RD 1*c*.

As illustrated in FIG. 2, a display surface of the OLED 1*a*, that is, a display surface on the front surface side of the display device 1 includes a light emitting region R11 and a transparent region R2. The light emitting region R11 and the transparent region R2 are regions different from each other in plan view, that is, on the x-y plane.

As illustrated in FIG. 3, a display surface of the RD 1*c*, that is, a display surface on the rear surface side of the display device 1 includes a reflection region R13 and a dimming region R3. The reflection region R13 and the dimming region R3 are regions different from each other in plan view.

On the other hand, the light emitting region R11 and the reflection region R13 are regions overlapping each other in plan view. The transparent region R2 and the dimming region R3 are regions overlapping each other in plan view.

The light emitting region R11 is a region where each of the plurality of light emitting sections 6 is arrayed. That is, the light emitting region R11 is a region R1 where light for display is emitted from the plurality of light emitting sections 6. FIG. 2 illustrates a case in which an R light emitting pixel, a G light emitting pixel, and a B light emitting pixel are provided in the light emitting regions R11.

The reflection region R13 is a region where each of the plurality of reflecting sections 4 is arrayed. That is, the reflection region R13 is the region R1 from which light for display is emitted by the plurality of reflecting sections 4. FIG. 3 illustrates a case in which an R reflecting pixel, a G reflecting pixel, and a B reflecting pixel are provided in the light emitting regions R11.

The transparent region R2 is a region between the plurality of light emitting sections 6.

The dimming region R3 is a region between the plurality of reflecting sections 4, that is, a region between the transparent electrode 71 and the transparent electrode 74*e* and is a region where each of the plurality of transmitting sections 9 is arrayed.

Next, action of the display device 1 according to the embodiment is explained.

Note that, in the following explanation, a mode in which light for display is emitted from each of the plurality of light emitting sections 6 is referred to as "light emission" mode. A mode in which light for display is emitted from each of the plurality of reflecting sections 4 is referred to as "reflection" mode. A mode in which external light is emitted from each of the plurality of transmitting sections 9 is referred to as "transmission" mode. A mode in which light for display is transmitted by controlling the transmittance of each of the plurality of transmitting sections 9 is referred to as "dimming" mode. As an example, a mode in which light for display is emitted from each of the plurality of light emitting sections 6 and light for display is emitted from each of the plurality of reflecting sections 4 is referred to as "light emission/reflection" mode.

In the following explanation, it is assumed that the dimming member 75 is TN liquid crystal.

Figure 4:
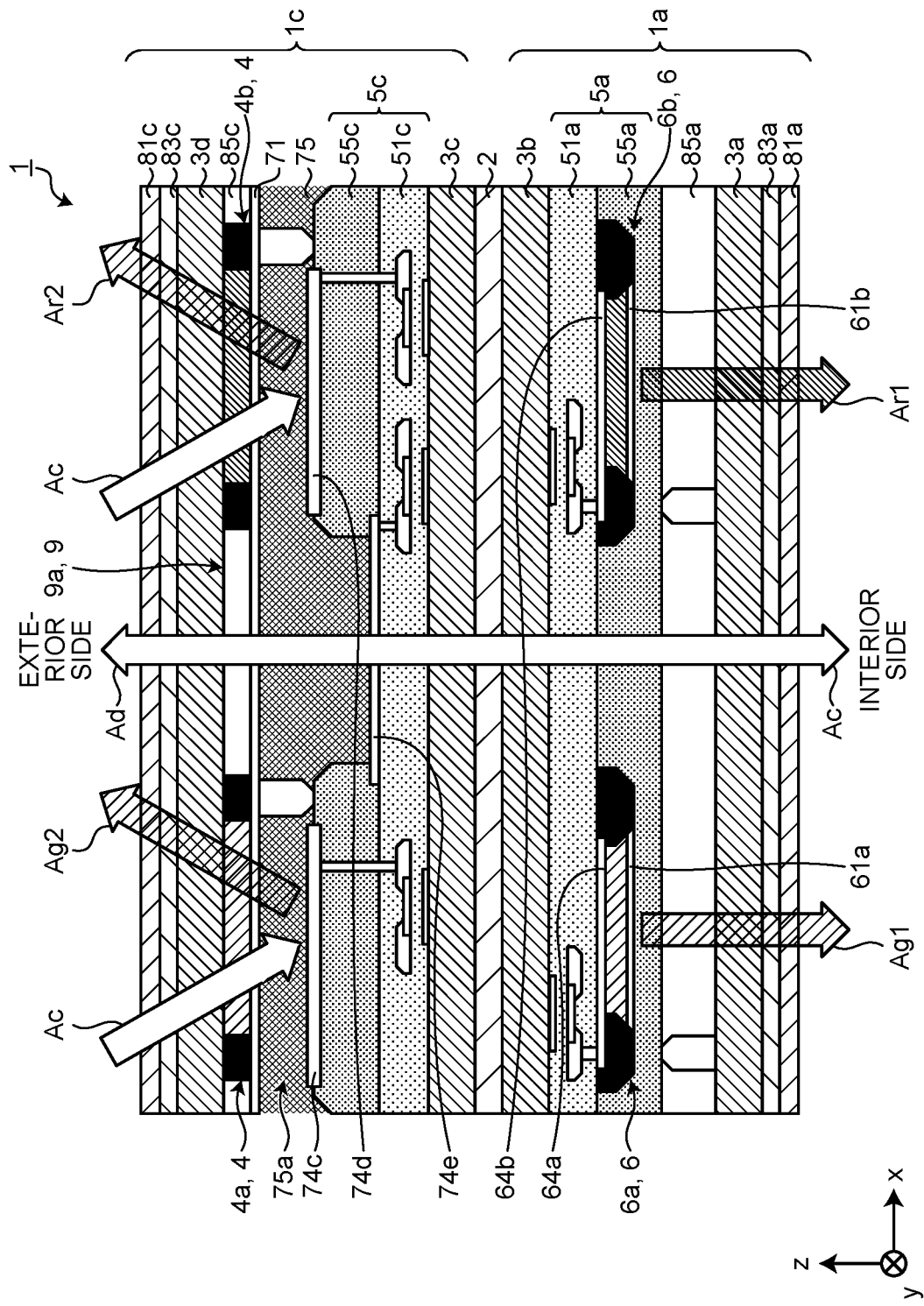
FIG. 4 is a diagram for explaining a "light emission/reflection/transmission" mode of the display device according to the first embodiment.

FIG. 4 is a diagram for explaining a "light emission/reflection/transmission" mode of the display device 1 according to the first embodiment.

In the "light emission/reflection/transmission" mode, the TFT substrate 5*a* feeds an electric current corresponding to a video to be output to between the transparent electrode 61*a* and the reflecting electrode 64*a* provided in positions corresponding to the video to be output and between the transparent electrode 61*b* and the reflecting electrode 64*b* provided in positions corresponding to the video to be output. Consequently, light from each of the plurality of light emitting sections 6 is emitted from the display surface of the OLED 1*a* as indicated by an arrow Ag1 and an arrow Ar1 in FIG. 4. That is, the OLED 1*a* is capable of outputting a video for the interior.

In the "light emission/reflection/transmission" mode, the TFT substrate 5*c* does not apply a voltage exceeding the threshold voltage between each of the reflecting electrode 74*c* and the reflecting electrode 74*d* provided in positions corresponding to the video to be output and the transparent electrode 71. That is, the dimming layer 7 becomes transparent to visible light. Consequently, as indicated by an arrow Ac, light is made incident on each of the reflecting electrode 74*c* and the reflecting electrode 74*d* via the polarizing plate 81*c*, the λ/4 phase difference plate 83*c*, the glass substrate 3*d*, the color filter 45*a*, the transparent electrode 71, and the dimming layer 7. Reflected light by each of the reflecting electrode 74*c* and the reflecting electrode 74*d* is emitted from the display surface of the RD 1*c* as indicated by an arrow Ag2 and an arrow Ar2. That is, the RD 1*c* is capable of outputting a video for the exterior.

In the "light emission/reflection/transmission" mode, the TFT substrate 5*c* does not apply a voltage exceeding the threshold voltage between all of the transparent electrodes 74*e* and the transparent electrode 71. Consequently, the transmitted light by each of the plurality of transmitting sections 9 is emitted from each of the display surface of the OLED 1*a* and the display surface of the RD 1*c* as indicated by an arrow Ac and an arrow Ad. That is, the display device 1 transmits an outdoor scene and an interior scene.

Therefore, in the "light emission/reflection/transmission" mode, the display device 1 can display, with the OLED 1*a*, a video for the interior on the outdoor scene. The display device 1 can display, with the RD 1*c*, the video for the exterior to be superimposed on the interior scene. With a configuration in which the video display for the doors is performed by the reflective RD 1*c*, the visibility can be improved using reflected light of external light without increasing display luminance even in an environment in which the external light is strong.

Figure 5:
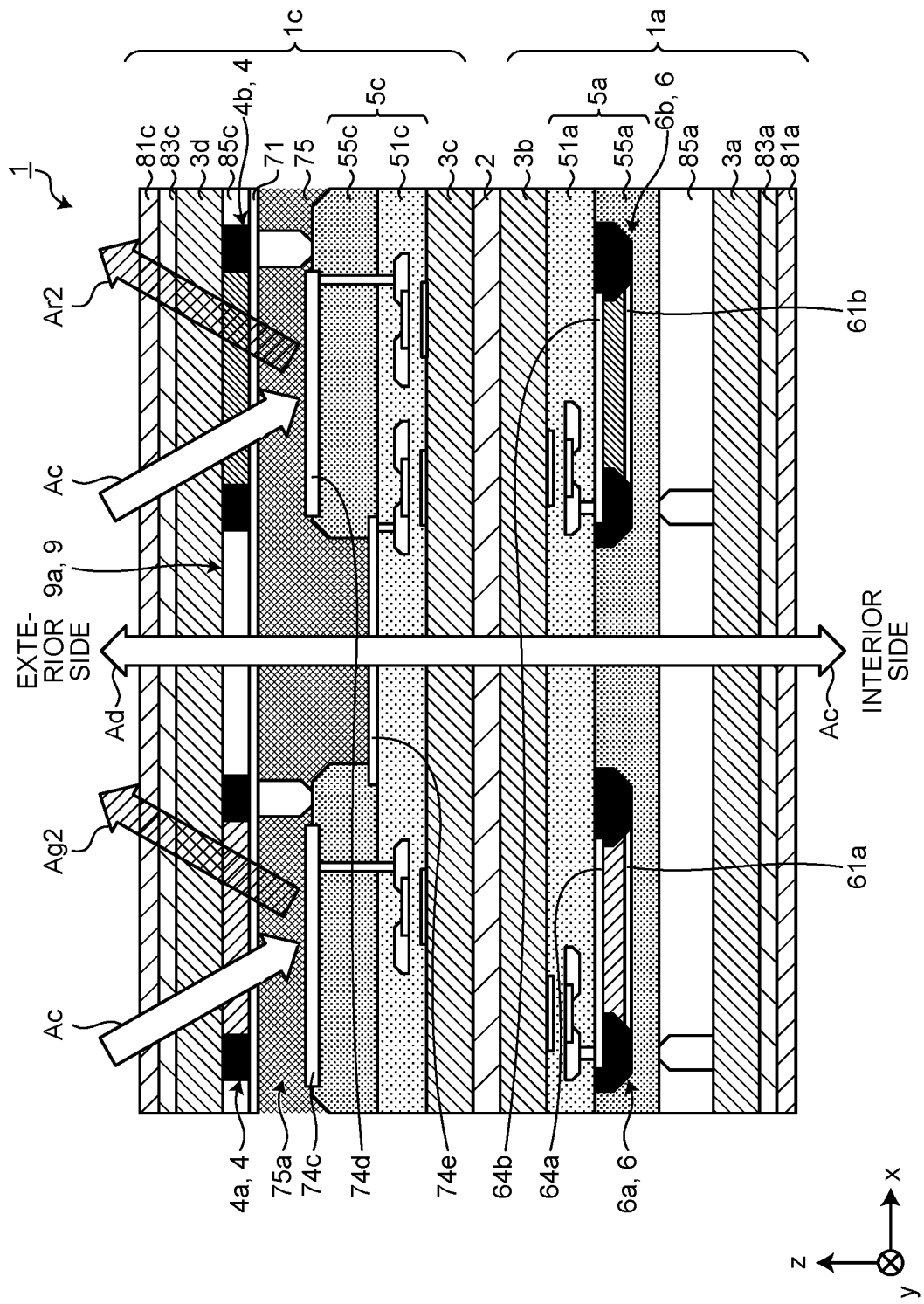
FIG. 5 is a diagram for explaining a "reflection/transmission" mode of the display device according to the first embodiment.

FIG. 5 is a diagram for explaining a "reflection/transmission" mode of the display device 1 according to the first embodiment.

In the "reflection/transmission" mode, the TFT substrate 5*a* does not feed an electric current between all of the transparent electrodes 61*a* and the reflecting electrodes 64*a* and between all of the transparent electrodes 61*b* and the reflecting electrodes 64*b*. Consequently, a video for the interior is not output from the OLED 1*a*.

In the "reflection/transmission" mode, the TFT substrate 5*c* does not apply a voltage exceeding the threshold voltage between each of the reflecting electrode 74c and the reflecting electrode 74d provided in positions corresponding to a video to be output and the transparent electrode 71. Consequently, the RD 1c is capable of outputting a video for the exterior.

In the "reflection/transmission" mode, the TFT substrate 5c does not apply a voltage exceeding the threshold voltage between all of the transparent electrodes 74e and the transparent electrode 71. Consequently, the display device 1 transmits an outdoor scene and an interior scene.

Therefore, in the "reflection/transmission" mode, the display device 1 can transmit the outdoor scene and the interior scene. That is, the user can view the outdoor scenery from the interior using the display device 1 as a window. The display device 1 can also display, with the RD 1c, a video for the exterior to be superimposed on the interior scene.

Figure 6:
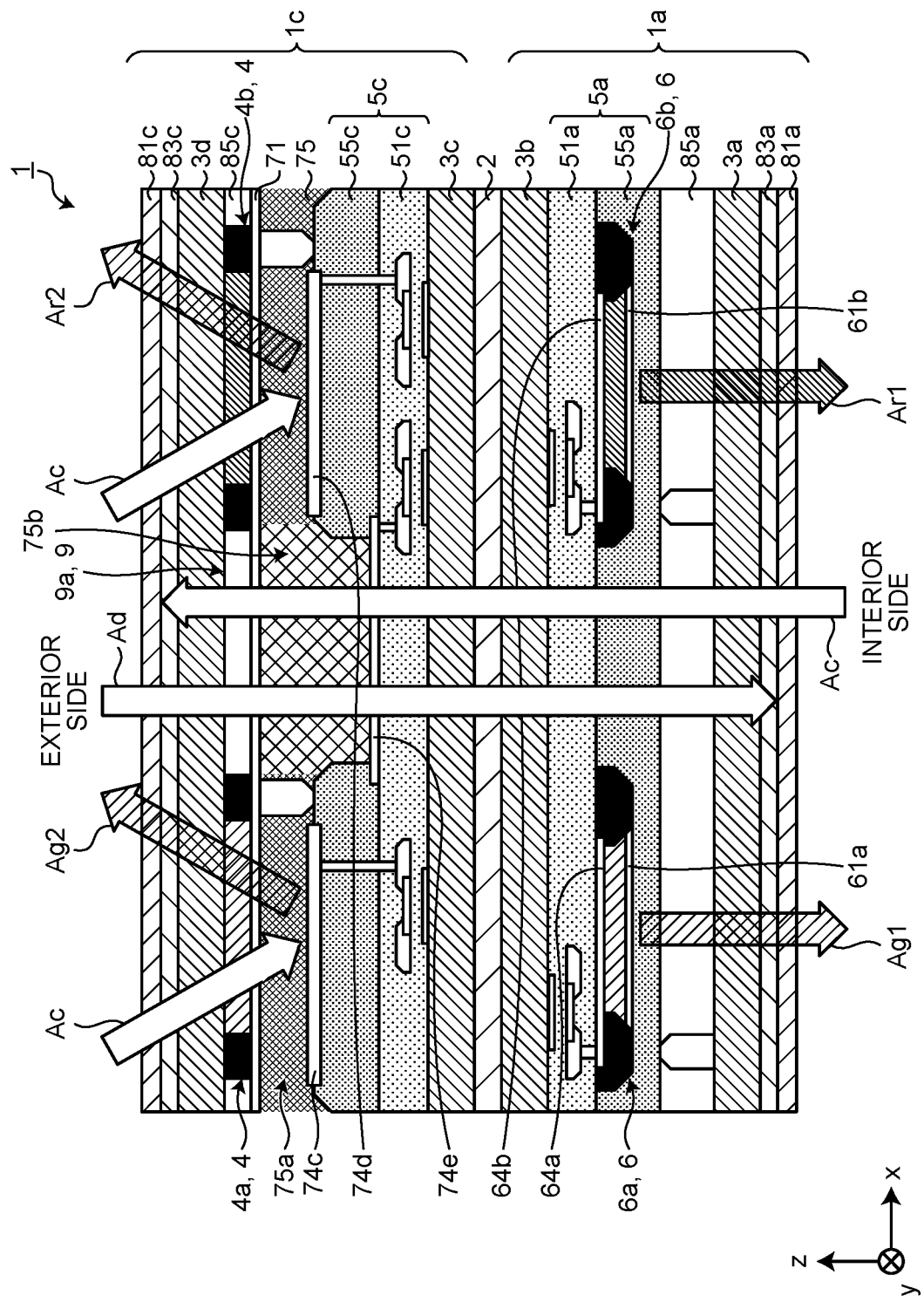
FIG. 6 is a diagram for explaining a "light emission/reflection" mode and a "light emission/reflection/dimming" mode of the display device according to the first embodiment.
Figure 7:
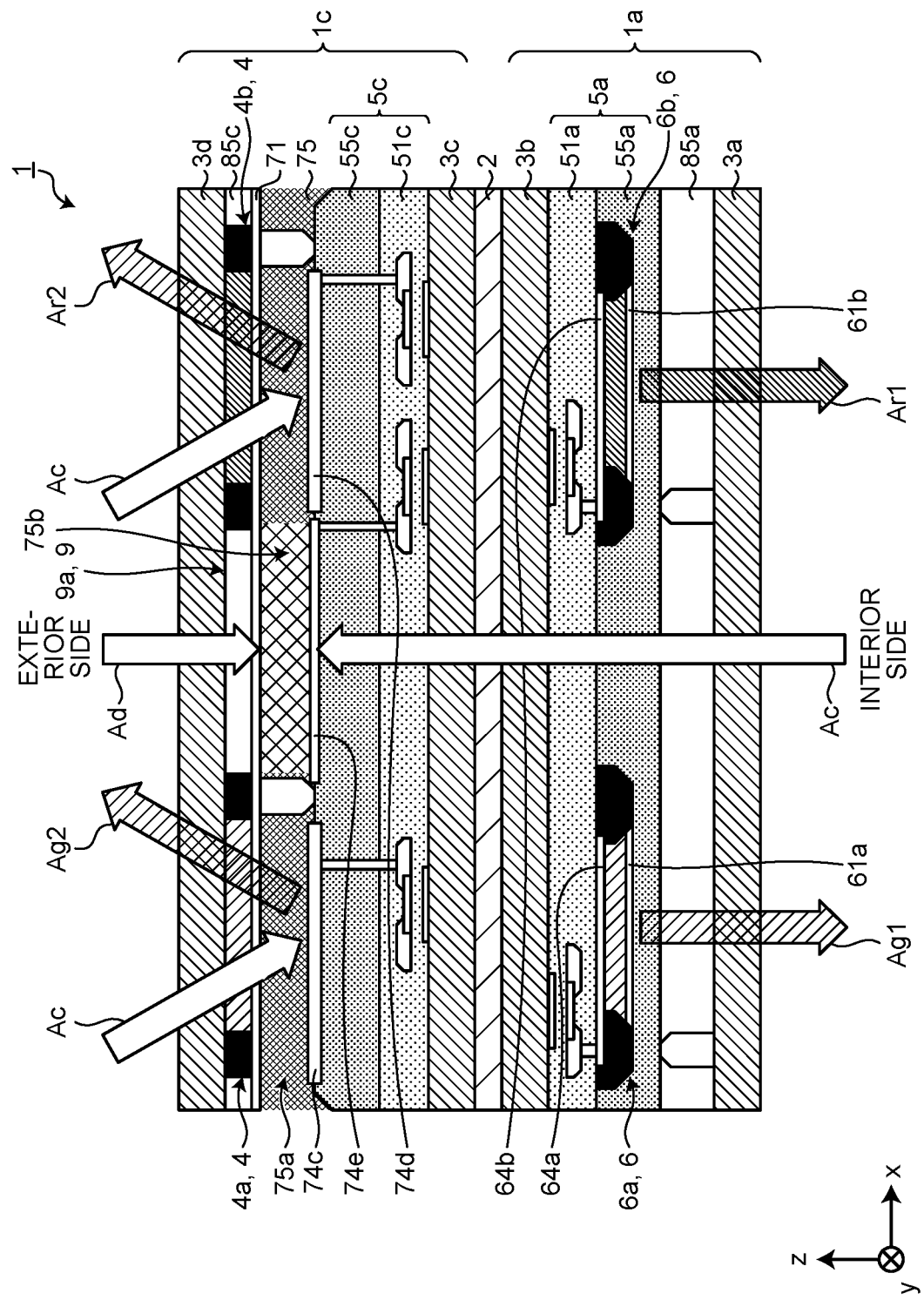
FIG. 7 is a diagram for explaining the "light emission/reflection" mode and the "light emission/reflection/dimming" mode of the display device according to the first embodiment.

FIG. 6 and FIG. 7 are respectively diagrams for explaining a "light emission/reflection" mode and a "light emission/reflection/dimming" mode of the display device 1 according to the first embodiment.

FIG. 6 illustrates a case in which the dimming member 75 requiring a concurrent use of the polarizing plate 81a and the polarizing plate 81c such as TN liquid crystal is used. Unlike FIG. 6, FIG. 7 illustrates a case in which the dimming member 75 not requiring a concurrent use of the polarizing plate 81a and the polarizing plate 81c such as guest-host liquid crystal is used. In this case, as illustrated in FIG. 7, the transparent electrode 74e and each of the reflecting electrode 74c and the reflecting electrode 74d are provided in the same or substantially the same position in the z direction. Therefore, whereas the distance d2 is twice or approximately twice the distance d1 in the example illustrated in FIG. 6, the distance d2 is equal or substantially equal to the distance d1 in the example illustrated in FIG. 7.

In the "light emission/reflection" mode and the "light emission/reflection/dimming" mode, the TFT substrate 5a feeds an electric current corresponding to a video to be output to between the transparent electrode 61a and the reflecting electrode 64a provided in positions corresponding to the video to be output and between the transparent electrode 61b and the reflecting electrode 64b provided in positions corresponding to the video to be output. Consequently, as illustrated in FIG. 6 and FIG. 7, the OLED 1a can output a video for the interior.

In the "light emission/reflection" mode and the "light emission/reflection/dimming" mode, the TFT substrate 5c does not apply a voltage exceeding the threshold voltage between each of the reflecting electrode 74c and the reflecting electrode 74d provided in positions corresponding to a video to be output and the transparent electrode 71. Consequently, as illustrated in FIG. 6 and FIG. 7, the RD 1c is capable of outputting a video for the exterior.

In the "light emission/reflection" mode, the TFT substrate 5c applies a voltage exceeding the threshold voltage between all of the transparent electrodes 74e and the transparent electrode 71. Consequently, when the dimming member 75 requiring a concurrent use of the polarizing plate 81a and the polarizing plate 81c is used, the dimming layer 7 sandwiched by the polarizing plate 81a and the polarizing plate 81c becomes opaque to visible light. Specifically, as indicated by the arrow Ad in FIG. 6, light made incident via the polarizing plate 81c and the dimming layer 7 is blocked by the polarizing plate 81a. As indicated by the arrow Ac in FIG. 6, light made incident via the polarizing plate 81a and the dimming layer 7 is blocked by the polarizing plate 81c. On the other hand, when the dimming member 75 not requiring a concurrent use of the polarizing plate 81a and the polarizing plate 81c is used, the dimming layer 7 becomes opaque to visible light. Specifically, as indicated by the arrow Ad and the arrow Ac in FIG. 7, light made incident via each of the glass substrate 3a and the glass substrate 3c is blocked by the dimming layer 7. Consequently, as illustrated in FIG. 6 and FIG. 7, the display device 1 does not transmit an outdoor scene and an interior scene.

Therefore, in the "light emission/reflection" mode, the display device 1 can block external light from the exterior or the interior and display only a video for the interior and a video for the exterior. That is, with the display device 1 in the "light emission/reflection" mode, even if strong external light is made incident on the RD 1c side from the exterior, for example, in a bright environment in the daytime, a video can be displayed on the OLED 1a in the interior without being affected by the external light.

Note that, in the "light emission/reflection/dimming" mode, the TFT substrate 5c can apply a voltage corresponding to a video to be output between the transparent electrode 74e and the transparent electrode 71 provided in positions corresponding to the video to be output. Consequently, each of the plurality of transmitting sections 9 can be set to any transmittance state from a transmission state to a light blocking state can be set according to a video to be output. The video can be output by the plurality of transmitting sections 9.

For example, in an environment such as daytime when the exterior is brighter than the interior, the display device 1 in the "light emission/reflection/dimming" mode further displays a video for the interior, which is the same as videos of the plurality of light emitting sections 6, by using external light transmitted through the plurality of transmitting sections 9 from the exterior side to the interior side. Consequently, it is possible to improve the visibility of a video for the interior on the display surface of the OLED 1a when strong external light is made incident.

For example, in an environment such as a nighttime environment when the interior is brighter than the exterior, the display device 1 in the "light emission/reflection/dimming" mode further displays a video for the exterior, which is the same as videos of the plurality of reflecting sections 4, using external light transmitted through the plurality of transmitting sections 9 from the interior side to the exterior side. Consequently, it is possible to improve the visibility of a video for the exterior on the display surface of the RD 1c.

Figure 8:
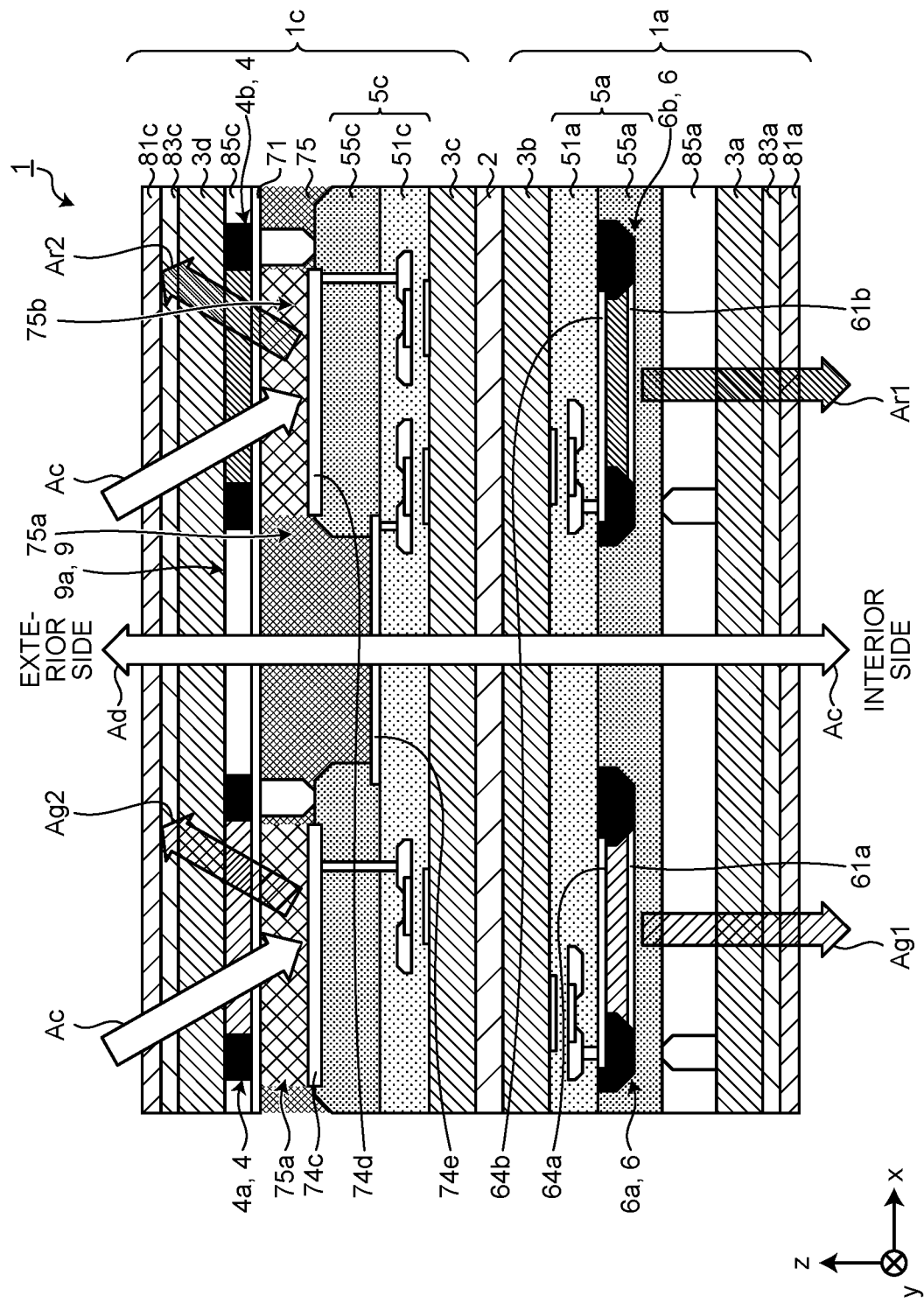
FIG. 8 is a diagram for explaining a "light emission/transmission" mode of the display device according to the first embodiment.
Figure 9:
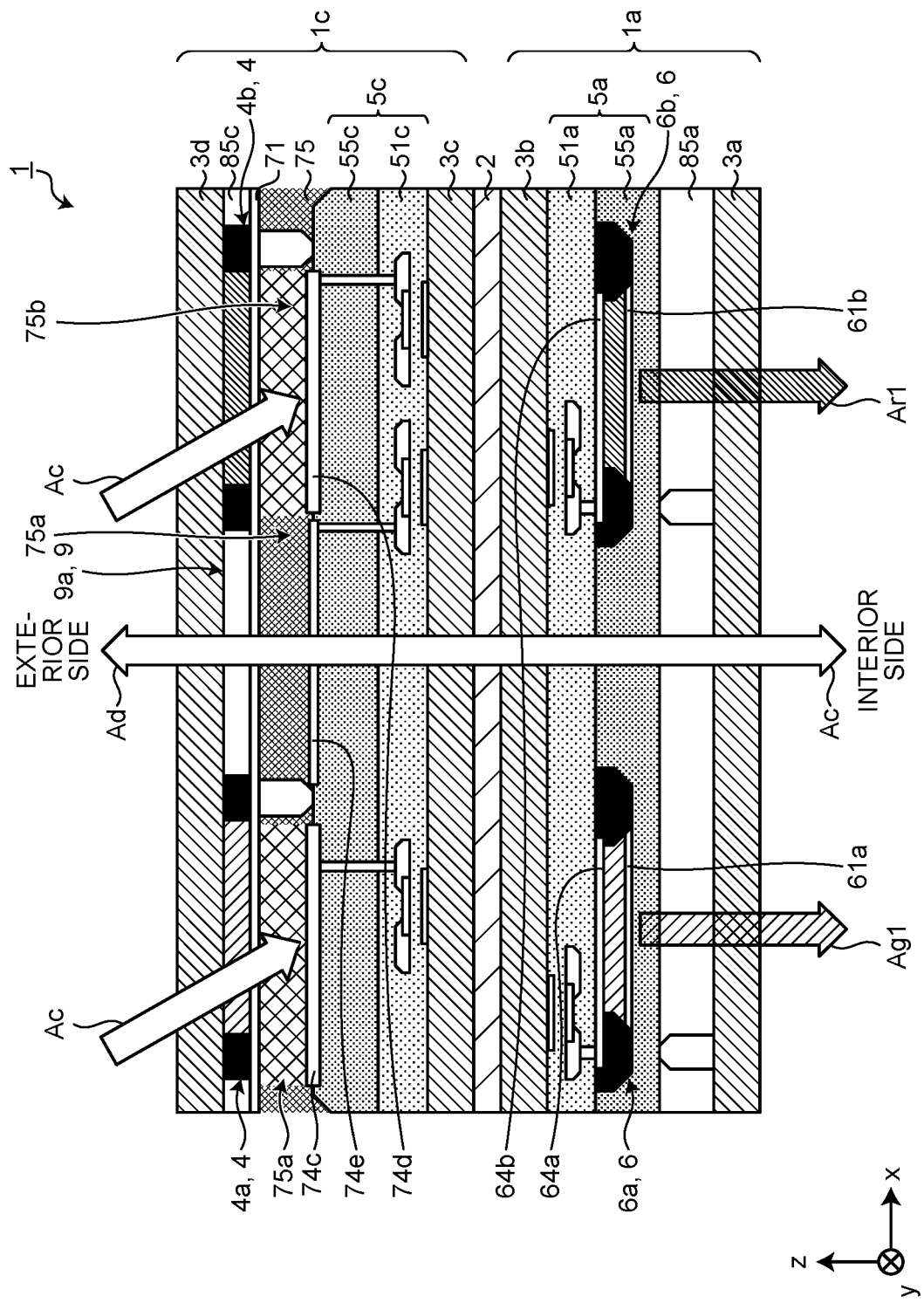
FIG. 9 is a diagram for explaining the "light emission/transmission" mode of the display device according to the first embodiment.

FIG. 8 and FIG. 9 are respectively diagrams for explaining a "light emission/transmission" mode of the display device 1 according to the first embodiment.

FIG. 8 illustrates a case in which the dimming member 75 requiring a concurrent use of the polarizing plate 81a and the polarizing plate 81c such as TN liquid crystal is used. Unlike FIG. 8, FIG. 9 illustrates a case in which the dimming member 75 not requiring a concurrent use of the polarizing plate 81a and the polarizing plate 81c such as guest-host liquid crystal is used. In this case, as illustrated in FIG. 9, the transparent electrode 74e and each of the reflecting electrode 74c and the reflecting electrode 74d are provided in the same or substantially the same position in the z direction. Therefore, whereas the distance d2 is twice or approximately twice the distance d1 in the example illustrated in FIG. 8, the distance d2 is equal or substantially equal to the distance d1 in the example illustrated in FIG. 9.

In the "light emission/transmission" mode, the TFT substrate 5a feeds an electric current corresponding to a video to be output to between the transparent electrode 61a and the reflecting electrode 64a provided in positions corresponding to the video to be output and between the transparent electrode 61b and the reflecting electrode 64b provided in positions corresponding to the video to be output. Consequently, the OLED 1a can output a video for the interior.

In the "light emission/transmission" mode, the TFT substrate 5c applies a voltage exceeding the threshold voltage between each of all of the reflecting electrodes 74c and 74d and the transparent electrode 71. Consequently, when the dimming member 75 requiring a concurrent use of the polarizing plate 81a and the polarizing plate 81c is used, light indicated by the arrow Ac in FIG. 8 made incident via the polarizing plate 81c and the dimming layer 7 is reflected by the reflecting electrode 74c and thereafter blocked by the polarizing plate 81c. On the other hand, when the dimming member 75 not requiring a concurrent use of the polarizing plate 81a and the polarizing plate 81c is used, light indicated by the arrow Ac in FIG. 9 made incident via the glass substrate 3c is blocked by the dimming layer 7. Consequently, as illustrated in FIG. 8 and FIG. 9, a video for the exterior is not output from the RD 1c.

In the "light emission/transmission" mode, the TFT substrate 5 c does not apply a voltage exceeding the threshold voltage between all of the transparent electrodes 74e and the transparent electrode 71. Consequently, the display device 1 transmits an outdoor scene and an interior scene.

Therefore, in the "light emission/transmission" mode, the display device 1 can transmit the outdoor scene and the interior scene. That is, an outdoor user can view the interior scene using the display device 1 as a window. The display device 1 can also display, with the OLED 1a, a video for the interior to be superimposed on the outdoor scene.

Note that, as explained with reference to FIG. 6, when a video is output using external light transmitted through the plurality of transmitting sections 9, at least one of video display by the plurality of reflecting sections 4 and video display by the plurality of light emitting sections 6 may not be performed. That is, the display device 1 can implement not only the "light emission/reflection/dimming" mode but also the "dimming" mode, the "light emission/dimming" mode, or the "reflection/dimming" mode.

Note that, although an example in which the TN liquid crystal is used as the dimming member 75 has been mainly explained, a method of applying the voltage for causing the dimming member to transition between the transmission mode and the dimming mode differs depending on a type of the dimming member 75. For example, a case in which the dimming member 75 is a normally white material is the same as the case in which the dimming member 75 is the TN liquid crystal. On the other hand, when the dimming member 75 is a normally black material, the dimming member can be set to the transmission mode by applying a voltage exceeding the threshold voltage and the dimming member can be set to the dimming mode by not applying a voltage exceeding the threshold voltage.

Note that a color filter 45 may be provided in each of the plurality of transmitting sections 9. For example, the plurality of transmitting sections 9 may include an R transmission pixel in which the same color filter 45 as the color filter 45 of the R reflecting pixel is provided, a G transmission pixel in which the same color filter 45 as the color filter 45 of the G reflecting pixel is provided, and a B transmission pixel in which the same color filter 45 as the color filter 45 of the B reflecting pixel is provided. With this configuration, since a color video can be output by the plurality of transmitting sections 9, the visibility of a video can be further improved.

Note that, for example, in an environment such as a nighttime environment when the interior is brighter than the exterior, when a video for the exterior is displayed by the plurality of reflecting sections 4, each of the plurality of reflecting sections 4 may be irradiated with illumination light. That is, the display device 1 may further include an illumination device configured to be capable of irradiating each of the plurality of reflecting sections 4 with illumination light.

As explained above, the display device 1 according to the present embodiment is a double-sided transparent display integrally formed by bonding the OLED 1a and the reflective and transmissive RD 1c. In the display device 1, the plurality of transmitting sections 9 are configured to be capable of controlling the transmittance of external light based on dimming data independently of video display by the plurality of reflecting sections 4 based on reflection data and the video display by the plurality of light emitting sections 6 based on video data.

With this configuration, it is possible to perform display with high definition by using the OLED 1a in the interior and with increased display luminance by using the reflective RD 1c in the exterior. That is, with the display device 1 according to the embodiment, it is possible to improve the visibility of the display device 1.

Since the liquid crystal for video display of the RD 1c is also used for dimming, it is unnecessary to separately provide a dimming element. It is possible to realize a reduction in thickness and weight of the device.

Second Embodiment

Figure 10:
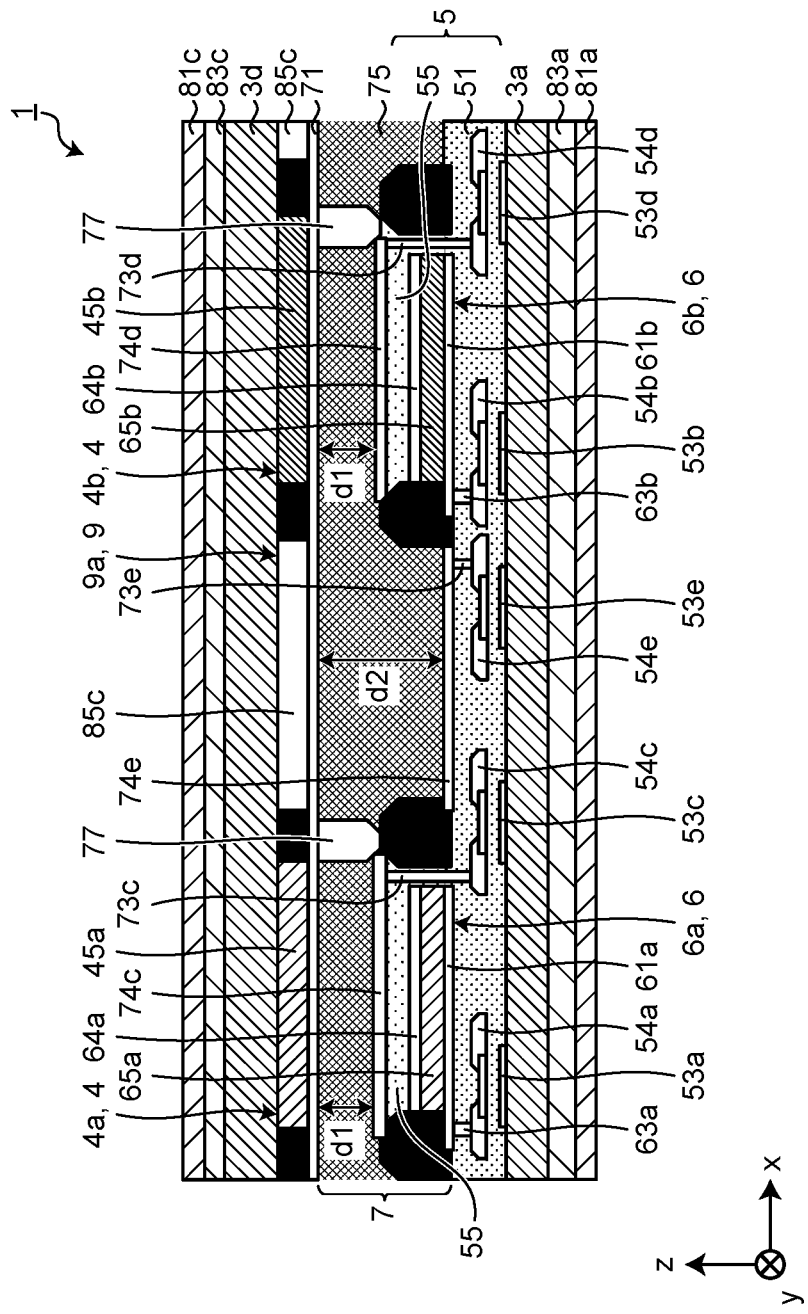
FIG. 10 is a cross-sectional view schematically illustrating an example of a configuration of a display device according to a second embodiment.

First, a configuration of the display device 1 according to the present embodiment is explained. Here, differences from the display device 1 according to the first embodiment are mainly explained and redundant explanation is omitted as appropriate. FIG. 10 is a cross-sectional view schematically illustrating an example of a configuration of the display device 1 according to a second embodiment. FIG. 2 illustrates a first cross section in a direction perpendicular to the surface on the rear surface side of the glass substrate 3a.

The display device 1 according to the present embodiment has a configuration in which an OLED configured as a bottom emission type transparent display and an RD configured as a reflective type transparent display are combined. Specifically, as illustrated in FIG. 10, the display device 1 according to the present embodiment has a configuration in which the components of the OLED 1a are incorporated in the RD 1c illustrated in FIG. 1.

As illustrated in FIG. 10, the display device 1 includes the glass substrate 3a, the glass substrate 3d, the TFT substrate 5, the dimming layer 7, the filter layer 8, the polarizing plate 81a, the polarizing plate 81c, the λ/4 phase difference plate 83a, and the λ/4 phase difference plate 83c.

The glass substrate 3a and the glass substrate 3d are disposed to be separated substantially in parallel. The glass substrate 3a is provided on the z− side, that is, the front surface side of the display device 1. The polarizing plate 81a and the λ/4 phase difference plate 83a are provided on the front surface side of the glass substrate 3a as in the display device 1 illustrated in FIG. 1. That is, the glass substrate 3a, the polarizing plate 81a, and the λ/4 phase difference plate 83a according to the present exemplary embodiment are provided in the position of the glass substrate 3c of the RD 1c illustrated in FIG. 1. The glass substrate 3d is provided on the z+ side of the display device 1, that is, on the rear surface side. The polarizing plate 81c and the λ/4 phase difference plate 83c are provided on the rear surface side of the glass substrate 3d as in the display device 1 illustrated in FIG. 1.

In the display device 1, the plurality of reflecting sections 4, the plurality of light emitting sections 6, and the plurality of transmitting sections 9 are provided. FIG. 10 illustrates the reflecting section 4a and the reflecting section 4b among the plurality of reflecting sections 4, the light emitting section 6a and the light emitting section 6b among the plurality of light emitting sections 6, and the transmitting section 9a among the plurality of transmitting sections 9.

The TFT substrate 5 is provided between the glass substrate 3a and the filter layer 8, for example, on the z+ side of the glass substrate 3a. Here, the glass substrate 3a according to the second embodiment is an example of the first substrate. The surface on the back surface side of the glass substrate 3a according to the second embodiment is an example of the first surface. The surface on the front surface side of the glass substrate 3a according to the second embodiment is an example of the second surface.

On the TFT substrate 5, the gate electrode 53a, the gate electrode 53b, the gate electrode 53c, the gate electrode 53d, the gate electrode 53e, the source-drain electrode 54a, the source-drain electrode 54b, the source-drain electrode 54c, the source-drain electrode 54d, the source-drain electrode 54e, the connecting electrode 63a, the connecting electrode 63b, the connecting electrode 73c, the connecting electrode 73d, and the connecting electrode 73e are provided. In the TFT substrate 5, each of the plurality of TFTs 102, the plurality of TFTs 113, and the plurality of TFTs 163 are covered by an insulating member 51 as in the display device 1 illustrated in FIG. 1. Each of the transparent electrode 61a, the transparent electrode 61b, the reflecting electrode 64a, the reflecting electrode 64b, the light emitting layer 65a, and the light emitting layer 65b is covered by an insulating member 55. That is, the plurality of TFTs 113 and the plurality of TFTs 163 according to the second embodiment are located between the light emitting layer 65a and the light emitting layer 65b and the glass substrate 3a. The reflecting electrode 64a and the reflecting electrode 74c and the reflecting electrode 64b and the reflecting electrode 74d are provided to be separated from each other substantially in parallel via the insulating member 55.

Here, the insulating member 51 according to the present embodiment corresponds to the insulating member 51a and the insulating member 51c of the display device 1 illustrated in FIG. 1. Similarly, the insulating member 55 according to the present embodiment corresponds to the insulating member 55a and the insulating member 55c of the display device 1 illustrated in FIG. 1. That is, the display device 1 according to the present embodiment is equivalent to a configuration in which the plurality of TFTs 102 provided in the insulating member 51a in the configuration of the display device 1 illustrated in FIG. 1 are provided in the insulating member 51c together with the plurality of TFTs 113 and the plurality of TFTs 163. Similarly, the display device 1 according to the present embodiment is equivalent to a configuration in which each of the transparent electrode 61a, the transparent electrode 61b, the reflecting electrode 64a, the reflecting electrode 64b, the light emitting layer 65a, and the light emitting layer 65b provided in the insulating member 55a in the configuration of the display device 1 illustrated in FIG. 1 is provided in the insulating member 55c between the reflecting electrode 74c and the insulating member 51c. Therefore, in the display device 1 according to the second embodiment, the surface on the front surface side of the TFT substrate 5 corresponds to and is in contact with the glass substrate 3a. In the display device 1 according to the second embodiment, a transparent electrode 74e is provided on the surface on the rear surface side of the TFT substrate 5.

Here, the TFT substrate 5 according to the second embodiment or layers of the plurality of TFTs 102, the plurality of TETs 113, and the plurality of TFTs 163 covered by the insulating member 51 in the TFT substrate 5 are an example of the first internal layer. The surface on the front surface side of the TFT substrate 5 according to the second embodiment is an example of the fifth surface. The surface on the rear surface side of the TFT substrate 5 according to the second embodiment is an example of the sixth surface. A circuit configuration including the plurality of TFTs 102 of the TFT substrate 5 according to the second embodiment is an example of the first circuit configuration. A circuit configuration including the plurality of TFTs 163 of the TFT substrate 5 according to the second embodiment is an example of the second circuit configuration. A circuit configuration including the plurality of TFTs 113 of the TFT substrate 5 according to the second embodiment is an example of the third circuit configuration.

Note that, unlike the display device 1 illustrated in FIG. 1, in the display device 1 according to the present embodiment, the adhesive layer 2, the glass substrate 3b, the glass substrate 3c, and the sealing layer 85a are not provided.

Figure 11:
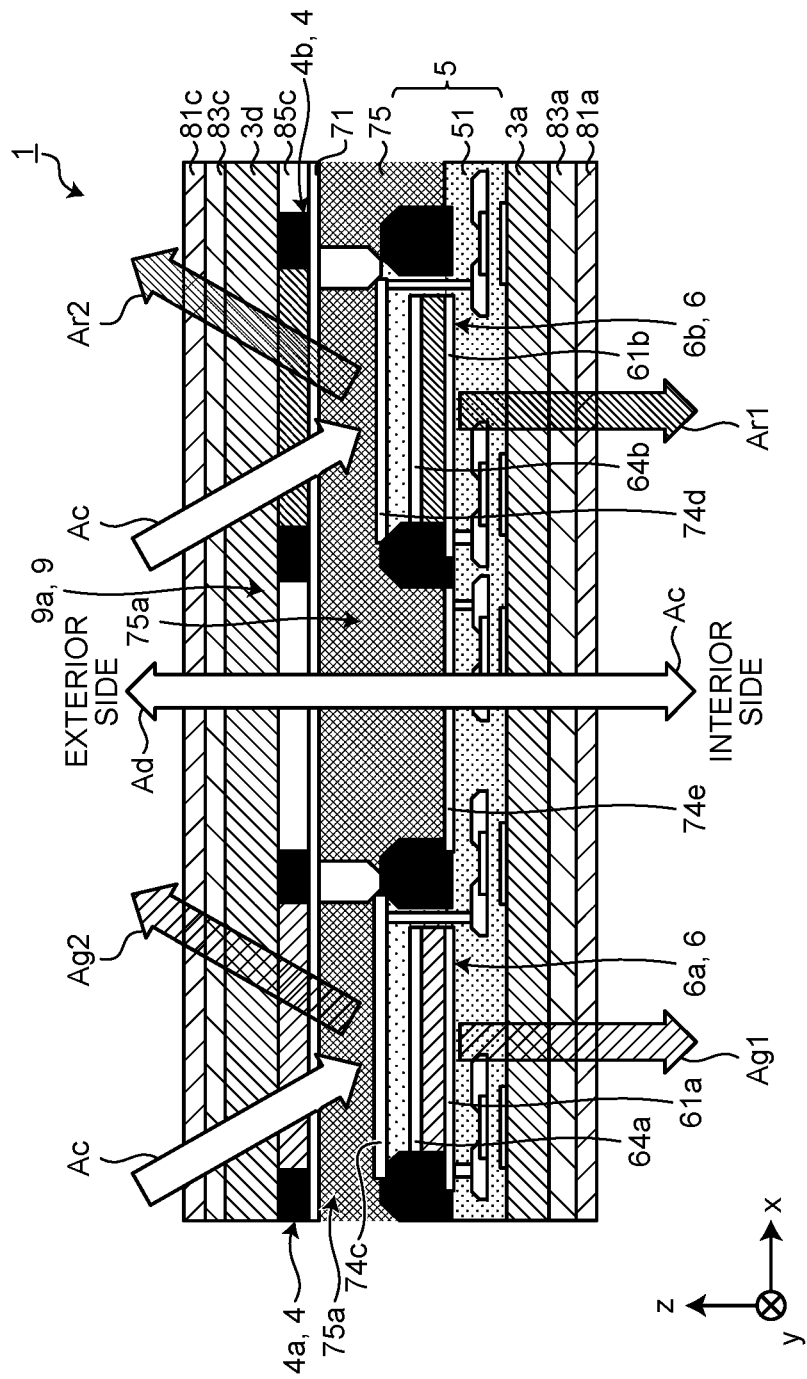
FIG. 11 is a diagram for explaining a "light emission/reflection/transmission" mode of the display device according to the second embodiment.

Next, action of the display device 1 according to the embodiment is explained. FIG. 11 is a diagram for explaining a "light emission/reflection/transmission" mode of the display device 1 according to the second embodiment.

In the "light emission/reflection/transmission" mode, the TFT substrate 5 applies a voltage exceeding a threshold voltage between the transparent electrode 61a and the reflecting electrode 64a provided in positions corresponding to a video to be output and between the transparent electrode 61b and the reflecting electrode 64b provided in positions corresponding to the video to be output. Consequently, light from each of the plurality of light emitting sections 6 is emitted from the display surface on the front surface side as indicated by the arrow Ag1 and the arrow Ar1 illustrated in FIG. 11. That is, the display device 1 is capable of outputting a video for the interior with the display surface on the front surface side.

In the "light emission/reflection/transmission" mode, the TFT substrate 5 does not apply a voltage exceeding the threshold voltage between each of the reflecting electrode 74c and the reflecting electrode 74d provided in positions corresponding to a video to be output and the transparent electrode 71. Consequently, as indicated by arrow Ac in FIG. 11, the light is made incident on each of the reflecting electrode 74c and the reflecting electrode 74d via the polarizing plate 81c, the λ/4 phase difference plate 83c, the glass substrate 3d, the color filter 45a, the transparent electrode 71, and the dimming member 75. The light reflected by each of the reflecting electrode 74c and the reflecting electrode 74d is emitted from the display surface on the rear surface side as indicated by the arrow Ag2 and the arrow Ar2 illustrated in FIG. 11. That is, the display device 1 is capable of outputting a video for the exterior with the display surface on the rear surface side.

In the "light emission/reflection/transmission" mode, the TFT substrate 5 does not apply a voltage exceeding the threshold voltage between all of the transparent electrodes 74e and the transparent electrode 71. Consequently, the transmitted light by each of the plurality of transmitting sections 9 is emitted from each of the display surfaces on both surface sides as indicated by the arrow Ac and the arrow Ad illustrated in FIG. 11. That is, the display device 1 transmits an outdoor scene and an interior scene.

Therefore, as in the display device 1 illustrated in FIG. 1, the display device 1 according to the present embodiment can display a video for the interior to be superimposed on an exterior scene and display a video for the exterior to be superimposed on an interior scene in the "light emission/reflection/transmission" mode.

Note that, like the display device 1 illustrated in FIG. 1, the display device 1 according to the present embodiment is capable of implementing not only the "light emission/reflection/transmission" mode and but also the modes of the "light emission" mode, the "reflection" mode, the "transmission" mode, the "dimming" mode, the "light emission/reflection" mode, the "light emission/transmission" mode, the "reflection/transmission" mode, the "light emission/dimming" mode, the "reflection/dimming" mode, and the "light emission/reflection/dimming" mode.

As explained above, the display device 1 according to the present embodiment is a double-sided transparent display integrally formed by combining the OLED 1a and the reflective and transmissive RD 1c. In the display device 1 according to the present embodiment, the plurality of light emitting sections 6 corresponding to the OLEDs 1a are configured as bottom emission type transparent displays. In general, the bottom emission type is easier to manufacture than the top emission type. Therefore, with the configuration according to the present embodiment, it is possible to reduce processes and the number of components relating to manufacturing and realize a further reduction in thickness, weight, and cost of the device compared with when the device is formed by bonding the OLED 1a and RD 1c.

Display Control in the Display Device

Here, a specific circuit configuration and display control of the display device 1 according to the embodiments explained above are explained with reference to the drawings. Here, the display device 1 according to the second embodiment is explained as an example.

Note that, in the explanation of the present disclosure, when the plurality of R light emitting pixels 100R_n, the plurality of G light emitting pixels 100G_n, and the plurality of B light emitting pixels 100B_n (n is a natural number) are not distinguished, the light emitting pixels are described as a plurality of light emitting pixels 100_n. Similarly, when the plurality of R reflecting pixels 160R_n, the plurality of G reflecting pixels 160G_n, and the plurality of B reflecting pixels 160B_n are not distinguished, the reflecting pixels are described as a plurality of reflecting pixels 160_n.

FIG. 12 is a diagram schematically illustrating an example of a circuit configuration of the display device 1 according to the embodiments.

As illustrated in FIG. 12, the TFT substrate 5 includes the plurality of light emitting pixels 100_n, the plurality of dimming pixels 110_n, and the plurality of reflecting pixels 160_n. The plurality of light emitting pixels 100_n, the plurality of dimming pixels 110_n, and the plurality of reflecting pixels 160_n have a circuit configuration in which the pixels are arrayed in a matrix on the TFT substrate 5.

The plurality of light emitting pixels 100_n configure the plurality of light emitting sections 6 and are configured to be capable of turning on and off light emission independently of one another. The plurality of dimming pixels 110_n configure the plurality of transmitting sections 9 and are configured to be capable of turning on and off transmission for visible light or changing the transmittance thereof independently of one another. The plurality of reflecting pixels 160_n configure the plurality of reflecting sections 4 and are configured to be capable of turning on and off reflection independently of one another.

For example, the plurality of R light emitting pixels 100R_n are arrayed in positions overlapping the plurality of R reflecting pixels 160R_n in plan view. For example, the plurality of G light emitting pixels 100G_n are arrayed in positions overlapping the plurality of G reflecting pixels 160G_n in plan view. For example, the plurality of B light emitting pixels 100B_n are arrayed in positions overlapping the plurality of B reflecting pixels 160B_n in plan view. For example, the plurality of dimming pixels 110_n are arrayed in positions different from the plurality of reflecting pixels 160_n in plan view.

As illustrated in FIG. 12, each of the plurality of light emitting pixels 100_n includes the light emitting element 101, a TFT 102, a TFT 105, a holding capacitor 106, and a holding capacitor 107.

The light emitting element 101 is a diode that emits light with luminance corresponding to a value of an electric current flowing between an anode and a cathode. The anode of the light emitting element 101 is electrically connected to the drain of the TFT 102. For example, the anode of the light emitting element 101 corresponding to the light emitting layer 65a is electrically connected to a source electrode of the source-drain electrode 54a via the transparent electrode 61a and the connecting electrode 63a. For example, the anode of the light emitting element 101 corresponding to the light emitting layer 65b is electrically connected to a source electrode of the source-drain electrode 54b via the transparent electrode 61b and the connecting electrode 63b. The cathode of the light emitting element 101 is electrically connected to a power supply wire 104 on a Vss side. For example, the cathode of the light emitting element 101 corresponding to the light emitting layer 65a is electrically connected to the power supply wire 104 on the Vss side via the reflecting electrode 64a. For example, the cathode of the light emitting element 101 corresponding to the light emitting layer 65b is electrically connected to the power supply wire 104 on the Vss side via the reflecting electrode 64b.

The TFT 102 is a drive transistor of the light emitting element 101. The TFT 102 is, for example, a P-type TFT. For example, the source and the drain of the TFT 102 correspond to the source-drain electrode 54a and the source-drain electrode 54b. The gate of the TFT 102 corresponds to the gate electrode 53a and the gate electrode 53b. The source of the TFT 102 is electrically connected to a power supply wire 103 on a Vdd side. The gate of the TFT 102 is electrically connected to the drain of the TFT 105. The gate of the TFT 102 is electrically connected to the power supply wire 103 on the Vdd side via the holding capacitor 106 and the holding capacitor 107. The TFT 102 supplies an electric current corresponding to a voltage held in the holding capacitor 106 and the holding capacitor 107 to the light emitting element 101.

The TFT 105 is a switch transistor of the light emitting element 101. The TFT 105 is, for example, a P-type TFT. The source of the TET 105 is electrically connected to a signal line 130 corresponding thereto. For example, in the R light emitting pixel 100R_n, the source of the TET 105 is electrically connected to a signal line 130R_n. For example, in the G light emitting pixel 100G_n, the source of the TFT 105 is electrically connected to a signal line 130G_n. For example, in the B light emitting pixel 100B_n, the source of the TFT 105 is electrically connected to a signal line 130B n. The gate of the TFT 105 is electrically connected to a scanning line drive circuit 121 via a scanning line Gate_n corresponding thereto. The drain of the TFT 105 is electrically connected to the gate of the TFT 102, one end of the holding capacitor 106, and one end of the holding capacitor 107. The TET 105 is turned on or off according to a voltage applied by the scanning line drive circuit 121.

The holding capacitor 106 and the holding capacitor 107 are electrically connected between the power supply wire 103 on the Vdd side and the power supply wire 104 on the Vss side. Specifically, the holding capacitor 106 is electrically connected between the drain of the TFT 105 and the power supply wire 103 on the Vdd side. The holding capacitor 107 is electrically connected between the drain of the TFT 105 and the power supply wire 104 on the Vss side. The holding capacitor 106 and the holding capacitor 107 hold a potential difference between the potential of the power supply wire 103 on the Vdd side and the potential of the gate of the TFT 102 at the time when the TFT 105 is turned off. That is, the holding capacitor 106 and the holding capacitor 107 hold a voltage corresponding to a signal voltage.

As illustrated in FIG. 12, each of the plurality of dimming pixels 110_n includes a liquid crystal element 111, a TFT 113, a holding capacitor 114, and a holding capacitor 115.

The liquid crystal element 111 corresponds to the dimming member 75 in a position corresponding to the transparent electrode 74e. One end of the liquid crystal element 111 is electrically connected to a power supply wire 112 on a Vcom side via the transparent electrode 71. The other end of the liquid crystal element 111 is electrically connected to the drain of the TFT 113, that is, a drain electrode of the source-drain electrode 54e via the transparent electrode 74e. The transmittance of the liquid crystal element 111 is controlled from the transmission state to the light blocking state by applying an alternating electric field between the transparent electrode 71 and the transparent electrode 74e.

The TFT 113 is a switch transistor of the liquid crystal element 111. The TFT 113 is, for example, a P-type TFT. For example, the source and the drain of the TFT 113 correspond to the source-drain electrode 54e. The gate of the TFT 113 corresponds to the gate electrode 53e. The source of the TFT 113 is electrically connected to a signal line 140T_n corresponding thereto. The gate of the TFT 113 is electrically connected to one end of the holding capacitor 114 and the scanning line Gate_n corresponding thereto. The drain of the TFT 113 is electrically connected to one end of the liquid crystal element 111, one end of the holding capacitor 114, and one end of the holding capacitor 115. The TFT 113 is turned on/off according to the voltage applied by the scanning line drive circuit 121.

The holding capacitor 114 and the holding capacitor 115 are electrically connected between scanning lines Gate_n and Gate_n+1 corresponding thereto. Specifically, the holding capacitor 114 is electrically connected between the gate and the drain of the TFT 113. The holding capacitor 115 is electrically connected between the drain of the TFT 113 and the scanning line Gate_n+1 corresponding thereto. The holding capacitor 114 and the holding capacitor 115 hold a voltage corresponding to a scanning signal from the scanning line drive circuit 121.

As illustrated in FIG. 12, each of the plurality of reflecting pixels 160_n includes a liquid crystal element 161, a TFT 163, a holding capacitor 164, and a holding capacitor 165.

The liquid crystal element 161 corresponds to the dimming member 75 in a position corresponding to the reflecting electrode 74c and the reflecting electrode 74d. One end of the liquid crystal element 161 is electrically connected to a power supply wire 162 on the Vcom side via the transparent electrode 71. The other end of the liquid crystal element 161 is electrically connected to the drain of the TFT 113. For example, in the R reflecting pixel 160R_n, the other end of the liquid crystal element 161 is electrically connected to a drain electrode of the source-drain electrode 54d via the reflecting electrode 74d. For example, in the G reflecting pixel 160G_n, the other end of the liquid crystal element 161 is electrically connected to a drain electrode of the source-drain electrode 54c via the reflecting electrode 74c. The transmittance of the liquid crystal element 161 is controlled from the transmission state to the light blocking state by applying an alternating electric field between the transparent electrode 71 and the reflecting electrode 74c and between the transparent electrode 71 and the reflecting electrode 74d.

The TFT 163 is a switch transistor of the liquid crystal element 161. The TFT 163 is, for example, a P-type TFT. The source and the drain of the TFT 163 correspond to the source-drain electrode 54c and the source-drain electrode 54d. The gate of the TFT 163 corresponds to the gate electrode 53c and the gate electrode 53d. The source of the TFT 163 is electrically connected to a signal line 140 corresponding thereto. For example, in the R reflecting pixel 160R_n, the source of the TFT 163 is electrically connected to a signal line 140R_n. For example, in the G reflecting pixel 160G_n, the source of the TFT 163 is electrically connected to a signal line 140G_n. For example, in the B reflecting pixel 160B_n, the source of the TFT 163 is electrically connected to a signal line 140B_n. A gate of the TFT 163 is electrically connected to one end of the holding capacitor 164 and the scanning line Gate_n corresponding thereto. The drain of the TFT 163 is electrically connected to one end of the liquid crystal element 161, one end of the holding capacitor 164, and one end of the holding capacitor 165. The TFT 163 is turned on/off according to a voltage applied by the scanning line drive circuit 121.

The holding capacitor 164 and the holding capacitor 165 are electrically connected between the scanning lines Gate_n and the Gate_n+1 corresponding thereto. Specifically, the holding capacitor 164 is electrically connected between the gate and the drain of the TFT 163. The holding capacitor 165 is electrically connected between the drain of the TFT 163 and the scanning line Gate_n+1 corresponding thereto. The holding capacitor 164 and the holding capacitor 165 hold a voltage corresponding to a scanning signal from the scanning line drive circuit 121.

Note that a holding capacitor provided in the TFT substrate 5 is formed simultaneously with a TFT using the same material as the TFT. The holding capacitor provided on the TFT substrate 5 is, for example, a capacitive element having structure in which an electrode, an insulating film, and an electrode are stacked in this order.

As illustrated in FIG. 12, the TFT substrate 5 includes the scanning line Gate_n, the scanning line Gate_n+1 (n is a natural number), the scanning line drive circuit 121, a plurality of signal lines 130, an OLED drive circuit 131, a plurality of signal lines 140, an LCD drive circuit 141, and a timing control circuit 150.

The scanning line drive circuit 121 is electrically connected to the scanning line Gate_n and the scanning line Gate_n+1. The scanning line Gate_n is electrically connected to the gate of the TFT 105 of the light emitting pixel 100_n corresponding thereto, the gate of the TFT 113 of the dimming pixel 110_n corresponding thereto, and the gate of the TFT 163 of the reflecting pixel 160_n corresponding thereto. The scanning line Gate_n+1 is electrically connected to the drain of each of the TFTs 113 via the holding capacitor 115 of the dimming pixel 110_n corresponding thereto.

The scanning line drive circuit 121 outputs a scanning signal to the scanning line Gate_n and the scanning line Gate_n+1 to scan the plurality of light emitting pixels 100_n in order. Specifically, the TFT 105 of the light emitting pixel 100_n is turned on or off in units of rows. Consequently, the scanning line drive circuit 121 applies a signal voltage output from the OLED drive circuit 131 to the plurality of light emitting pixels 100_n of a selected row by the signal line 130 corresponding thereto and causes each of the light emitting elements 101 of the plurality of light emitting pixels 100_n to emit light with luminance corresponding to video data.

Similarly, the scanning line drive circuit 121 outputs a scanning signal to the scanning line Gate_n and the scanning line Gate_n+1 to sequentially scan the plurality of dimming pixels 110_n and the plurality of reflecting pixels 160_n. Specifically, the TFT 113 of the dimming pixel 110_n and the TFT 163 of the reflecting pixel 160_n are turned on or off in units of rows. Consequently, the scanning line drive circuit 121 applies the signal voltage output from the LCD drive circuit 141 to the plurality of dimming pixels 110_n and the plurality of reflecting pixels 160_n in the selected row via the signal line 140 corresponding thereto, changes the transmittance of the liquid crystal element 111 of each of the plurality of dimming pixels 110_n according to dimming data, and changes the reflectance of the liquid crystal element 161 of each of the plurality of reflecting pixels 160_n according to reflection data.

The OLED drive circuit 131 applies a signal voltage corresponding to the video data to each of the plurality of light emitting pixels 100_n via the plurality of signal lines 130. The signal line 130R_n is electrically connected to the source of the TFT 105 of the R light emitting pixel 100R_n. The signal line 130R_n supplies a video signal Sig_OLED-R_n corresponding to the video data to the R light emitting pixel 100R_n. The signal line 130G_n is electrically connected to the source of the TFT 105 of the G light emitting pixel 100G_n. The signal line 130G_n supplies the video signal Sig_OLED-G_n corresponding to the video data to the G light emitting pixel 100G_n. The signal line 130B n is electrically connected to the source of the TET 105 of the B light emitting pixel 100B_n. The signal line 130B n supplies the video signal Sig_OLED-B_n corresponding to the video data to the B light emitting pixel 100B_n. Here, the R light emitting pixel 100R_n is a pixel of an OLED that emits red light. The G light emitting pixel 100G_n is an OLED pixel that emits green light. The B light emitting pixel 100B_n is an OLED pixel that emits blue light.

The LCD drive circuit 141 applies a signal voltage corresponding to dimming data and reflection data to each of the plurality of dimming pixels 110_n and the plurality of reflecting pixels 160_n via the plurality of signal lines 140. The signal line 140T_n is electrically connected to the source of the TFT 113 of the dimming pixel 110_n. The signal line 140T_n supplies a dimming signal Sig_LCD-T n corresponding to the dimming data to the dimming pixel 110_n. The signal line 140R_n is electrically connected to the source of the TFT 163 of the R reflecting pixel 160R_n. The signal line 140R_n supplies a reflection signal Sig_LCD-R_n corresponding to the reflection data to the R reflecting pixel 160R_n. The signal line 140G_n is electrically connected to the source of the TFT 163 of the G reflecting pixel 160G_n. The signal line 140G_n supplies a reflection signal Sig_LCD-G_n corresponding to the reflection data to the G reflecting pixel 160G_n. The signal line 140B_n is electrically connected to the source of the TET 163 of the B reflecting pixel 160B_n. The signal line 140B_n supplies a reflection signal Sig_LCD-B_n corresponding to the reflection data to the B reflecting pixel 160B_n. Here, the R reflecting pixel 160R_n is a pixel of an LCD in which a color filter that transmits red light is provided. The G reflecting pixel 160G_n is a pixel of an LCD in which a color filter that transmits green light is provided. The B reflecting pixel 160B_n is a pixel of an LCD in which a color filter that transmits blue light is provided.

The timing control circuit 150 is electrically connected to each of the scanning line drive circuit 121, the OLED drive circuit 131, and the LCD drive circuit 141. The timing control circuit 150 controls operation timings of the scanning line drive circuit 121, the OLED drive circuit 131, and the LCD drive circuit 141 based on an input image signal. Here, the timing control circuit 150 according to the embodiment is an example of the control circuit.

Figure 13:
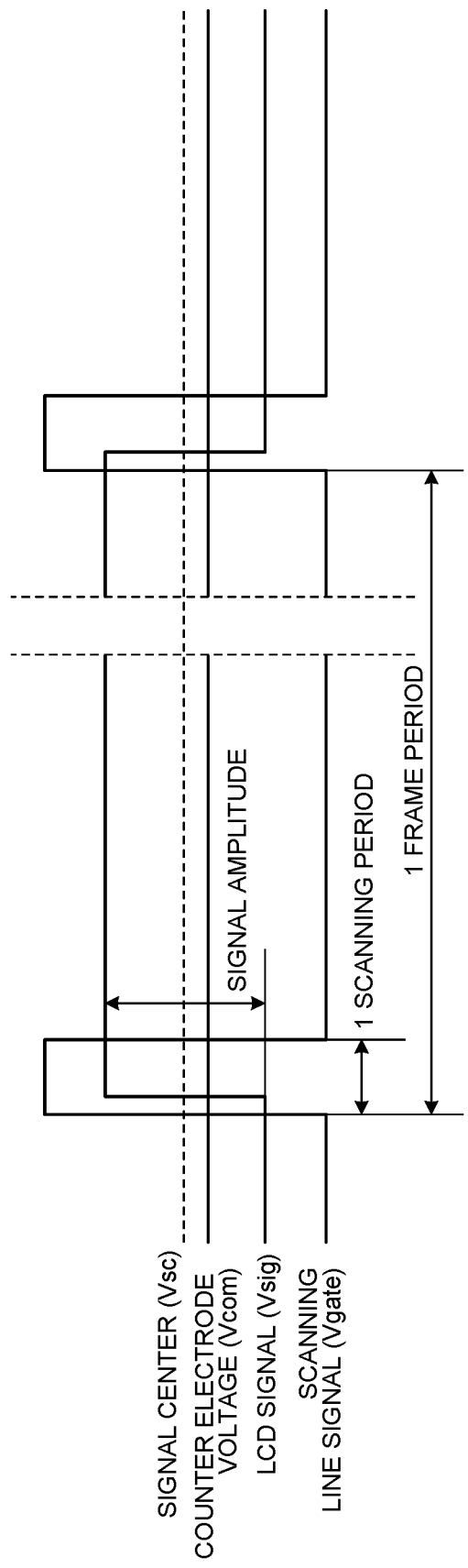
FIG. 13 is a signal waveform chart schematically illustrating an example of dimming control of the display device according to the embodiments.

FIG. 13 is a signal waveform chart schematically illustrating an example of dimming control of the display device 1 according to the embodiments.

As illustrated in FIG. 13, the timing control circuit 150 controls the scanning line drive circuit 121 to raise a scanning line signal Vgate at timing corresponding to the input image signal. The scanning line drive circuit 121 generates, for example, a rectangular pulse signal at timing conforming to the control of the timing control circuit 150, scans the plurality of light emitting pixels 100_n in order, and scans the plurality of dimming pixels 110_n and the plurality of reflecting pixels 160_n in order. Therefore, the pulse width of the pulse signal corresponds to one scanning period.

Based on the input image signal, the timing control circuit 150 supplies a signal voltage corresponding to the video data to the OLED drive circuit 131 and supplies a signal voltage corresponding to the dimming data and the reflection data to the LCD drive circuit 141.

Here, as illustrated in FIG. 12, the timing control circuit 150 controls, based on the input image signal, for each frame, the amplitude of the dimming signal applied from the LCD drive circuit 141 to each of the plurality of dimming pixels 110_n.

As explained above, the timing control circuit 150 controls, based on the input image signal, for each frame, the amplitude of the LCD signal Vsig as a dimming signal applied to each of the plurality of dimming pixels 110_n. In other words, the timing control circuit 150 controls the transmittance of the liquid crystal element 111 of the dimming pixel 110_n from transmission to light blocking based on the input image signal.

The timing control circuit 150 can control light emission of the plurality of light emitting pixels 100_n, the transmittance of the plurality of dimming pixels 110, and the reflectance of the plurality of reflecting pixels 160_n by controlling rising timing of the scanning line signal Vgate based on the input image signal. In other words, the timing control circuit 150 can control light emission, dimming, and reflection of the pixels in the display device 1 with one gate pulse signal. With this configuration, dimming in pixel units corresponding to a display image can be easily realized.

As hardware of the timing control circuit 150, for example, a processor such as an ASIC (Application Specific Integrated Circuit) or an FPGA (Field Programmable Gate Array) can be used as appropriate.

Note that the timing control circuit 150 includes, for example, a processor such as a CPU (Central Processing Unit) and a memory such as a RAM (Random Access Memory) and may implement the control explained above by the processor executing a control program loaded in the memory. In this case, the control program may be provided by being incorporated in advance in, for example, a ROM (Read Only Memory). The control program may be provided by being recorded in a computer-readable recording medium such as a CD-ROM, a flexible disk (FD), a CD-R, or a DVD (Digital Versatile Disk) as a file in an installable format or an executable format. Further, the control program may be stored on a computer connected to a network such as the Internet and provided by being downloaded via the network. The control program may be provided or distributed through a network such as the Internet.

According to at least one embodiment explained above, the visibility of the display device can be improved.

According to the present disclosure, it is possible to improve visibility of a display device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

(Notes)

The following technique is disclosed by the description of the embodiments explained above.

(1) A display device comprising:
a first substrate including a first surface and a second surface on an opposite side of the first surface, the first substrate transmitting visible light in a direction perpendicular to the first surface and the second surface;
a plurality of light emitting pixels configured to be capable of emitting light independently of one another;
a first internal layer disposed on the first surface, the first internal layer including a first circuit configuration that is a circuit configuration electrically connected to each of the plurality of light emitting pixels;
a second substrate transmitting visible light;
a liquid crystal layer located between the first substrate and the second substrate in a first cross section that is a cross section in a direction perpendicular to the first surface;
a first electrode located between at least one of the plurality of light emitting pixels and the liquid crystal layer in the first cross section, the first electrode reflecting visible light;
a second electrode located between the liquid crystal layer and the first substrate in the first cross section without overlapping with the first electrode in plan view, the second electrode transmitting visible light;
a third electrode located between the liquid crystal layer and the second substrate in the first cross section while overlapping the first electrode in plan view, the third electrode transmitting visible light; and
a fourth electrode located between the liquid crystal layer and the second substrate in the first cross section while overlapping the second electrode in plan view, the fourth electrode transmitting visible light.

(2) The display device according to (1), further comprising a first color filter located between the third electrode and the second substrate in the first cross section.

(3) The display device according to (2), wherein the first color filter is located between the fourth electrode and the second substrate in the first cross section.

(4) The display device according to any one of (1) to (3), wherein
the liquid crystal layer includes a first portion located between the first electrode and the third electrode and a second portion located between the second electrode and the fourth electrode, and
thickness of the second portion is twice thickness of the first portion.

(5) The display device according to any one of (1) to (4), further comprising a first polarizing layer and a second polarizing layer that polarize visible light, wherein
the first substrate is located between the first polarizing layer and the second electrode in the first cross section, and
the second substrate is located between the second polarizing layer and the third electrode in the first cross section.

(6) The display device according to (5), further comprising:
a first λ/4 phase difference plate located between the first polarizing layer and the first substrate in the first cross section; and
a second λ/4 phase difference plate located between the second polarizing layer and the second substrate in the first cross section.

(7) The display device according to any one of (1) to (6), wherein
the third electrode and the fourth electrode are integrally formed.

(8) The display device according to any one of (1) to (7), wherein
the plurality of light emitting pixels are located between the first internal layer and the first substrate in the first cross section.

(9) The display device according to (8), further comprising a third substrate transmitting visible light, wherein
the plurality of light emitting pixels are located between the first substrate and the third substrate in the first cross section.

(10) The display device according to (9), further comprising:
a fourth substrate including a third surface and a fourth surface on an opposite side of the third surface, the fourth substrate transmitting visible light in a direction perpendicular to the third surface and the fourth surface; and
a second internal layer disposed on the third surface, the second internal layer including a second circuit configuration that is a circuit configuration electrically connected to the first electrode and a third circuit configuration that is a circuit configuration electrically connected to the second electrode, wherein
the liquid crystal layer is located between the second substrate and the fourth substrate in the first cross section.

(11) The display device according to any one of (1) to (7), wherein
the first internal layer is located between the plurality of light emitting pixels and the first substrate in the first cross section.

(12) The display device according to (11), wherein
the first internal layer includes a fifth surface that faces and is in contact with the first surface and a sixth surface that is located on an opposite side of the fifth surface, and the second electrode is disposed on the sixth surface.

(13) The display device according to (12), wherein
the first internal layer includes a second circuit configuration that is a circuit configuration electrically connected to the first electrode and a third circuit configuration that is a circuit configuration electrically connected to the second electrode.

What is claimed is:

1. A display device comprising:
   a first substrate including a first surface and a second surface on an opposite side of the first surface, the first substrate transmitting visible light in a direction perpendicular to the first surface and the second surface;
   a plurality of light emitting pixels configured to be capable of emitting light independently of one another;
   a first internal layer disposed on the first surface, the first internal layer including a first circuit configuration that is a circuit configuration electrically connected to each of the plurality of light emitting pixels;
   a second substrate transmitting visible light;
   a liquid crystal layer located between the first substrate and the second substrate in a first cross section that is a cross section in a direction perpendicular to the first surface;
   a first electrode located between at least one of the plurality of light emitting pixels and the liquid crystal layer in the first cross section, the first electrode reflecting visible light;
   a second electrode located between the liquid crystal layer and the first substrate in the first cross section without overlapping with the first electrode in plan view, the second electrode transmitting visible light;
   a third electrode located between the liquid crystal layer and the second substrate in the first cross section while overlapping the first electrode in plan view, the third electrode transmitting visible light; and
   a fourth electrode located between the liquid crystal layer and the second substrate in the first cross section while overlapping the second electrode in plan view, the fourth electrode transmitting visible light.

2. The display device according to claim 1, further comprising a first color filter located between the third electrode and the second substrate in the first cross section.

3. The display device according to claim 2, wherein the plurality of light emitting pixels are located between the first internal layer and the first substrate in the first cross section.

4. The display device according to claim 2, wherein the first color filter is located between the fourth electrode and the second substrate in the first cross section.

5. The display device according to claim 4, wherein the plurality of light emitting pixels are located between the first internal layer and the first substrate in the first cross section.

6. The display device according to claim 1, wherein the liquid crystal layer includes a first portion located between the first electrode and the third electrode and a second portion located between the second electrode and the fourth electrode, and
   thickness of the second portion is twice thickness of the first portion.

7. The display device according to claim 6, wherein the plurality of light emitting pixels are located between the first internal layer and the first substrate in the first cross section.

8. The display device according to claim 1, further comprising a first polarizing layer and a second polarizing layer that polarize visible light, wherein
   the first substrate is located between the first polarizing layer and the second electrode in the first cross section, and
   the second substrate is located between the second polarizing layer and the third electrode in the first cross section.

9. The display device according to claim 8, further comprising:
   a first λ/4 phase difference plate located between the first polarizing layer and the first substrate in the first cross section; and
   a second λ/4 phase difference plate located between the second polarizing layer and the second substrate in the first cross section.

10. The display device according to claim 9, wherein the plurality of light emitting pixels are located between the first internal layer and the first substrate in the first cross section.

11. The display device according to claim 8, wherein the plurality of light emitting pixels are located between the first internal layer and the first substrate in the first cross section.

12. The display device according to claim 1, wherein the third electrode and the fourth electrode are integrally formed.

13. The display device according to claim 12, wherein the plurality of light emitting pixels are located between the first internal layer and the first substrate in the first cross section.

14. The display device according to claim 1, wherein the plurality of light emitting pixels are located between the first internal layer and the first substrate in the first cross section.

15. The display device according to claim 14, further comprising a third substrate transmitting visible light, wherein
   the plurality of light emitting pixels are located between the first substrate and the third substrate in the first cross section.

16. The display device according to claim 15, further comprising:
   a fourth substrate including a third surface and a fourth surface on an opposite side of the third surface, the fourth substrate transmitting visible light in a direction perpendicular to the third surface and the fourth surface; and
   a second internal layer disposed on the third surface, the second internal layer including a second circuit configuration that is a circuit configuration electrically connected to the first electrode and a third circuit configuration that is a circuit configuration electrically connected to the second electrode, wherein
   the liquid crystal layer is located between the second substrate and the fourth substrate in the first cross section.

17. The display device according to claim 1, wherein the first internal layer is located between the plurality of light emitting pixels and the first substrate in the first cross section.

18. The display device according to claim 17, wherein the first internal layer includes a fifth surface that faces and is in contact with the first surface and a sixth surface that is located on an opposite side of the fifth surface, and
   the second electrode is disposed on the sixth surface.

19. The display device according to claim 18, wherein the first internal layer includes a second circuit configuration that is a circuit configuration electrically connected to the first electrode and a third circuit configuration that is a circuit configuration electrically connected to the second electrode.

* * * * *